(12) United States Patent
Yamanaka et al.

(10) Patent No.: US 7,615,331 B2
(45) Date of Patent: Nov. 10, 2009

(54) PHOTOSENSITIVE RESIN COMPOSITION, PRODUCTION METHOD OF CURED RELIEF PATTERN USING THE SAME AND SEMICONDUCTOR DEVICE

(75) Inventors: Tsukasa Yamanaka, Haibara-gun (JP); Kenichiro Sato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/851,751

(22) Filed: Sep. 7, 2007

(65) Prior Publication Data

US 2008/0081294 A1 Apr. 3, 2008

(30) Foreign Application Priority Data

Sep. 28, 2006 (JP) ............................. 2006-264818

(51) Int. Cl.
*G03F 7/004* (2006.01)
*G03F 7/30* (2006.01)

(52) U.S. Cl. .................... 430/270.1; 430/191; 430/192; 430/193; 430/281.1; 430/288.1; 430/326; 430/330

(58) Field of Classification Search ............... 430/191, 430/192, 193, 281.1, 288.1, 325, 330, 270.1, 430/326

See application file for complete search history.

(56) References Cited

U.S. PATENT DOCUMENTS

| | | | | |
|---|---|---|---|---|
| 5,486,447 A | * | 1/1996 | Hammerschmidt et al. | 430/197 |
| 6,143,467 A | * | 11/2000 | Hsu et al. | 430/270.1 |
| 6,177,225 B1 | * | 1/2001 | Weber et al. | 430/190 |
| 6,376,151 B1 | * | 4/2002 | Takahashi et al. | 430/192 |
| 6,929,891 B2 | * | 8/2005 | Rushkin et al. | 430/18 |
| 7,101,652 B2 | * | 9/2006 | Naiini et al. | 430/190 |
| 7,129,011 B2 | * | 10/2006 | Rushkin et al. | 430/18 |
| 7,132,205 B2 | * | 11/2006 | Rushkin et al. | 430/18 |
| 7,220,520 B2 | * | 5/2007 | Naiini et al. | 430/18 |
| 7,282,323 B2 | * | 10/2007 | Kanatani et al. | 430/281.1 |
| 2004/0142275 A1 | * | 7/2004 | Komatsu | 430/270.1 |
| 2004/0253537 A1 | * | 12/2004 | Rushkin et al. | 430/270.1 |
| 2007/0154843 A1 | * | 7/2007 | Kanada et al. | 430/311 |

FOREIGN PATENT DOCUMENTS

| | | |
|---|---|---|
| JP | 63-147160 A | 6/1988 |
| JP | 2003241377 A | 8/2003 |
| JP | 2006047377 A | 2/2006 |
| WO | 2005/000912 A2 | 1/2005 |

OTHER PUBLICATIONS

Extended European Search Report dated Apr. 7, 2009.

* cited by examiner

*Primary Examiner*—John S Chu
(74) *Attorney, Agent, or Firm*—Sughrue Mion, PLLC

(57) ABSTRACT

A photosensitive resin composition contains: a polymer represented by the formula (I) as defined herein, in which 0.5 mol % or more of A in the polymer represented by the formula (I) is a protective group; a photosensitizing agent; a compound containing a methacryloyl or acryloyl group within a molecule of the compound; and a solvent.

8 Claims, No Drawings

PHOTOSENSITIVE RESIN COMPOSITION, PRODUCTION METHOD OF CURED RELIEF PATTERN USING THE SAME AND SEMICONDUCTOR DEVICE

FIELD OF THE INVENTION

The present invention relates to a highly heat-resistant positive photosensitive resin composition usable as a surface protective film or interlayer insulating film of a semiconductor device or as an interlayer insulating film for display devices, a production method of a heat-resistant cured relief pattern using the highly heat-resistant positive photosensitive resin composition, and a semiconductor device containing a relief pattern.

BACKGROUND OF THE INVENTION

A polyimide resin excellent in heat resistance, electrical properties, mechanical properties and the like is being used for the surface protective film or interlayer insulating film of a semiconductor device. This polyimide resin is generally provided at present in the form of a photosensitive polyimide precursor composition and has a characteristic feature that a surface protective film, an interlayer insulating film or the like can be easily formed on a semiconductor device by subjecting the composition to coating, patterning with actinic rays, development, thermal imidization treatment and the like and the process can be greatly shortened as compared with conventional non-photosensitive polyimide precursor compositions.

However, in the development step of the photosensitive polyimide precursor composition, a large amount of an organic solvent such as N-methyl-2-pyrrolidone must be used as the developer. Meanwhile, with increased environmental concern in recent years, measures for an organic solvent-free composition are demanded. In this connection, various proposals have been recently made for a heat-resistant photosensitive resin material which is developable with an aqueous alkaline solution similarly to the photoresist.

Above all, a method where a PBO precursor composition prepared by mixing an aqueous alkaline solution-soluble hydroxypolyamide, for example, a polybenzoxazole (hereinafter sometimes referred to as "PBO") precursor, with a photoactive component such as photosensitive diazoquinone compound is used as the positive photosensitive resin composition, is drawing attention in recent years.

This positive photosensitive resin has a development mechanism utilizing a phenomenon such that although the photosensitive diazoquinone compound in the unexposed area is insoluble in an aqueous alkaline solution, the photosensitive diazoquinone compound when exposed causes a chemical change and is converted into an indenecarboxylic acid compound which is soluble in an aqueous alkaline solution. By making use of this difference in the dissolution rate in a developer between the exposed area and the unexposed area, a relief pattern of only the unexposed area can be formed. However, in the photosensitive composition allowing the above-described photosensitive diazoquinone compound to mainly participate in the image formation, it is difficult to satisfy both high sensitivity and high resolving power, because the photosensitive diazoquinone compound solely undertakes the functions of photosensitivity and insolubility of the unexposed area.

On the other hand, as for the technique of separating the functions of photosensitivity and insolubility of the unexposed area, a large number of chemical amplification-type photosensitive compositions where an acid in a catalytic amount is generated upon exposure and the alkali-insoluble group in the composition is converted into an alkali-soluble group by a chemical reaction using the acid generated upon exposure as the catalyst in the subsequent heating process, are applied in the field of semiconductor photoresist. Also in the technical field of the present invention, a chemical amplification-type photosensitive composition is disclosed (see, for example, JP-A-2003-241377 (the term "JP-A" as used herein means an "unexamined published Japanese patent application")).

However, in the chemical amplification-type photosensitive composition, the photosensitizing agent is used in a small amount for bringing out the characteristic features of the composition, as a result, the photosensitizing agent comes to be present at a low density in the film and film defects ascribable to the photosensitizing agent sometimes give rise to insufficient physical properties of the film.

Also, with recent development of the semiconductor technology, fine fabrication is required and a material ensuring high resolving power comparable to the photoresist for semiconductors and small difference (mask bias) between the mask dimension and the pattern dimension after curing is demanded. In this meaning, development of a material having a lithography performance of the semiconductor photoresist level and giving a film with satisfactory physical properties by low-temperature curing is longing for (see, for example, JP-A-2006-047377)

SUMMARY OF THE INVENTION

An object of the present invention is to provide a photosensitive resin composition having a lithography performance comparable to a semiconductor photoresist and enabling the formation of a cured relief pattern excellent in the mechanical properties by low-temperature curing, a production method of a cured relief pattern using the photosensitive resin composition, and a semiconductor device comprising a cured relief pattern obtained by the production method.

The present inventors have found that the above-described problems can be overcome by a photosensitive resin composition comprising a polymer having a specific structure and a compound containing a methacryloyl or acryloyl group within the molecule, and accomplished the present invention. That is, the object of the present invention is attained by the following constructions.

[1] A photosensitive resin composition comprising (1) a polymer in which at least one of hydroxyl groups is protected by a protective group, represented by formula (I), (2) a photosensitizing agent, (3) a compound containing a methacryloyl or acryloyl group within the molecule, and (4) a solvent:

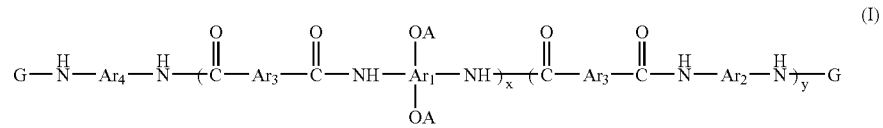

wherein $Ar_1$ represents a group selected from a tetravalent aromatic group and a tetravalent heterocyclic group, $Ar_2$ represents a group selected from a divalent aromatic group, a divalent heterocyclic group, a divalent alicyclic group and a divalent aliphatic group which may contain silicon, $Ar_3$ represents a group selected from a divalent aromatic group, a (1) Polymer in which at Least One of Hydroxyl Groups is Protected by a Protective Group The polymer for use in the present invention, where at least one of hydroxyl groups is protected by a protective group and the solubility in an alkali developer is thereby reduced, is represented by the following formula.

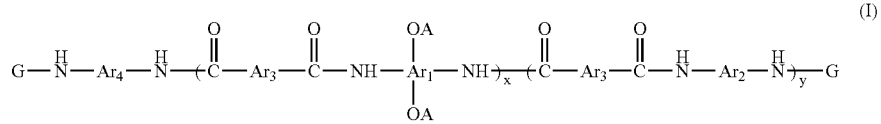

divalent heterocyclic group, a divalent aliphatic group and a divalent alicyclic group, $Ar_4$ represents a group selected from —$Ar_1(OA)_2$- and $Ar_2$, A represents a hydrogen atom or a protective group, G represents a monovalent organic group bonded through a carbonyl group or a sulfonyl group, x represents a number of 5 to 1,000, and y represents a number of 0 to 900, provided that 0.5 mol % or more of A in the polymer represented by formula (I) is a protective group.

[2] The photosensitive resin composition as described in [1] above, wherein the protective group represented by A is a group capable of decomposing by the reaction with an acid.

[3] The photosensitive resin composition as described in [1] above, wherein the protective group represented by A is a protective group capable of decomposing under heating at 150 to 350° C.

[4] The photosensitive resin composition as described in [1] or [2] above, wherein the photosensitizing agent is a photoacid generator.

[5] The photosensitive resin composition as described in any one of [1] to [4] above, wherein a photoacid generator and a quinonediazide compound are contained as the photosensitizing agent.

[6] The photosensitive resin composition as described in any one of [1] to [5] above, which further comprises a sulfonic acid ester compound.

[7] The photosensitive resin composition as described in any one of [1] to [6] above, which further comprises an adhesion promoter.

[8] A production method of a cured relief pattern, comprising forming a layer of the photosensitive resin composition described in [1] to [7] above on a semiconductor substrate, exposing the layer to a light beam, an electron beam or an ion beam through a mask, removing the exposed area with an aqueous alkali developer, and heat-treating the obtained relief pattern.

[9] A semiconductor device comprising a cured relief pattern obtained by the production method described in [8] above.

A photosensitive resin composition ensuring small mask bias and high resolving power and becoming a cured film with excellent mechanical properties when cured at a low temperature can be provided.

DETAILED DESCRIPTION OF THE INVENTION

The present invention is described in detail below.

The photosensitive resin composition of the present invention comprises (1) a polymer in which at least one of hydroxyl groups is protected by a protective group, represented by formula (I), (2) a photosensitizing agent, (3) a compound containing a methacryloyl or acryloyl group within the molecule, and (4) a solvent.

wherein $Ar_1$ represents a group selected from a tetravalent aromatic group and a tetravalent heterocyclic group, $Ar_2$ represents a group selected from a divalent aromatic group, a divalent heterocyclic group, a divalent alicyclic group and a divalent aliphatic group which may contain silicon, $Ar_3$ represents a group selected from a divalent aromatic group, a divalent heterocyclic group, a divalent aliphatic group and a divalent alicyclic group, $Ar_4$ represents a group selected from —$Ar_1(OA)_2$- and $Ar_2$, A represents a hydrogen atom or a protective group, G represents a monovalent organic group bonded through a carbonyl group or a sulfonyl group, x represents a number of 5 to 1,000, and y represents a number of 0 to 900, provided that 0.5 mol % or more of A in the polymer represented by formula (I) is a protective group.

The above-described polymer (sometimes referred to as a "polybenzoxazole precursor") generally has a polymerization degree of 10 to 1,000 and is synthesized by reacting the following monomers (A), (B) and (C) in the presence of a base or a dehydrating condensation agent.

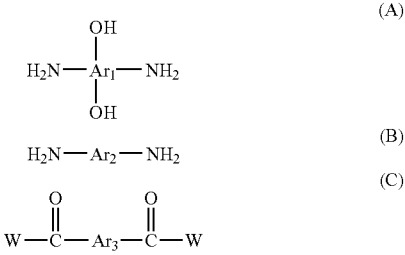

In these formulae, $Ar_1$, $Ar_2$ and $Ar_3$ are as defined above, and W is Cl, OR or OH, wherein R represents an alkyl group (preferably having a carbon number of 1 to 10), a cycloalkyl group (preferably having a carbon number of 3 to 10) or an aryl group (preferably having a carbon number of 6 to 10), such as —$CH_3$, —$C_2H_5$, n-$C_3H_7$, i-$C_3H_7$, n-$C_4H_9$, tert-$C_4H_9$, cyclohexyl, phenyl, p-chlorophenyl or p-nitrophenyl.

The ratio [(A)+(B)]/(C) is generally between about 0.9 and 1.1. The monomer (A) accounts for about 10 to 100 mol % of [(A)+(B)], and the monomer (B) accounts for about 0 to 90 mol % of [(A)+(B)].

Examples of the bisaminophenol having the structure of (A) $Ar_1(NH_2)_2(OH)_2$ include 3,3'-dihydroxybenzidine, 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis-(3-amino-4-hydroxyphenyl)methane, 2,2-bis(3-amino-4-hydroxyphenyl)propane, 2,2-bis(3-amino-4-hydroxyphenyl)hexafluoropropane, 2,2-bis(4-amino-3-hydroxyphenyl)

hexafluoropropane, bis-(4-amino-3-hydroxyphenyl)methane, 2,2-bis-(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene and 1,3-diamino-4,6-dihydroxybenzene. These bisaminophenols may be used individually or as a mixture.

Among these bisaminophenols having the structure of (A), preferred are those where $Ar_1$ is an aromatic group selected from the followings.

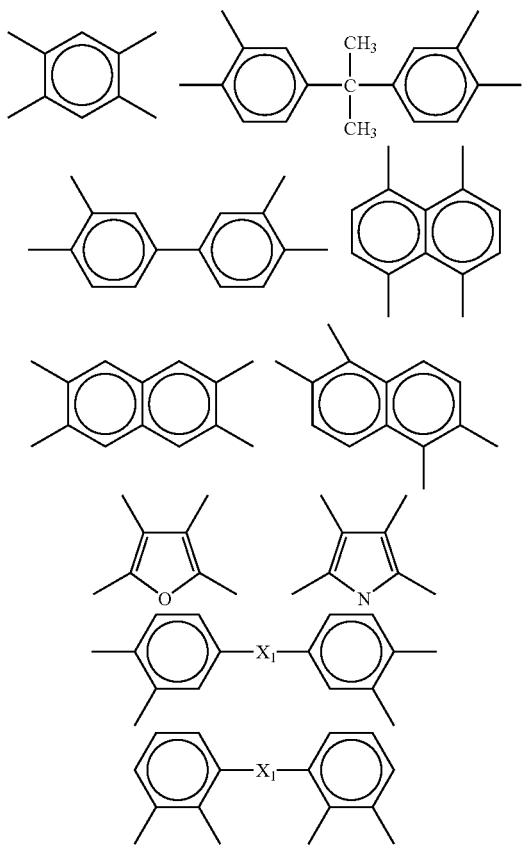

wherein $X_1$ represents —O—, —S—, —C(CF$_3$)$_2$—, —CH$_2$—, —SO$_2$— or —NHCO—. In the structure above, —OH and —NH$_2$ contained in the structure of (A) are bonded at the ortho-position (adjacent position) to each other.

Examples of the diamine having the structure of (B) $Ar_2$(NH$_2$)$_2$ include an aromatic diamine and a silicon diamine.

Examples of the aromatic diamine include m-phenylenediamine, p-phenylenediamine, 2,4-tolylenediamine, 3,3'-diaminodiphenyl ether, 3,4'-diaminodiphenyl ether, 4,4'-diaminodiphenyl ether, 3,3'-diaminodiphenyl sulfone, 4,4'-diaminodiphenyl sulfone, 3,4'-diaminodiphenyl sulfone, 3,3'-diaminodiphenylmethane, 4,4'-diaminodiphenylmethane, 3,4'-diaminodiphenylmethane, 4,4'-diaminodiphenyl sulfide, 3,3'-diaminodiphenyl ketone, 4,4'-diaminodiphenyl ketone, 3,4'-diaminodiphenyl ketone, 2,2'-bis(4-aminophenyl)propane, 2,2'-bis(4-aminophenyl)hexafluoropropane, 1,3-bis(3-aminophenoxy)benzene, 1,3-bis(4-aminophenoxy)benzene, 1,4-bis(4-aminophenoxy)benzene, 4-methyl-2,4-bis(4-aminophenyl)-1-pentene, 4-methyl-2,4-bis(4-aminophenyl)-2-pentene, 1,4-bis(α,α-dimethyl-4-aminolbenzyl)benzene, imino-di-p-phenylenediamine, 1,5-diaminonaphthalene, 2,6-diaminonaphthalene, 4-methyl-2,4-bis(4-aminophenyl)pentane, 5(or 6)-amino-1-(4-aminophenyl)-1,3,3-trimethylindane, bis(p-aminophenyl)phosphineoxide, 4,4'-diaminoazobenzene, 4,4'-diaminodiphenylurea, 4,4'-bis(4-aminophenoxy)biphenyl, 2,2-bis[4-(4-aminophenoxy)phenyl]propane, 2,2-bis[4-(4-aminophenoxy)phenyl]hexafluoropropane, 2,2-bis[4-(3-aminophenoxy)phenyl]benzophenone, 4,4'-bis(4-aminophenoxy)diphenylsulfone, 4,4'-bis[4-(α,α-dimethyl-4-aminobenzyl)phenoxy]benzophenone, 4,4'-bis[4-(α,α-dimethyl-4-aminobenzyl)phenoxy]diphenylsulfone, 4,4'-diaminobiphenyl, 4,4'-diaminobenzophenone, phenylindanediamine, 3,3'-dimethoxy-4,4'-diaminobiphenyl, 3,3'-dimethyl-4,4'-diamino-biphenyl, o-toluidine-sulfone, 2,2-bis(4-aminophenoxyphenyl)propane, bis(4-aminophenoxyphenyl)sulfone, bis(4-aminophenoxyphenyl) sulfide, 1,4-(4-aminophenoxyphenyl)benzene, 1,3-(4-aminophenoxyphenyl)benzene, 9,9-bis(4-aminophenyl)fluorene, 4,4'-di-(3-aminophenoxy)diphenylsulfone, 4,4'-diaminobenzanilide, and a compound where a hydrogen atom in the aromatic nucleus of the aromatic diamine above is substituted by at least one group or atom selected from the group consisting of a chlorine atom, a fluorine atom, a bromine atom, a methyl group, a methoxy group, a cyano group and a phenyl group.

Also, a silicon diamine may be selected for enhancing the adhesive property to the substrate, and examples thereof include bis(4-aminophenyl)dimethylsilane, bis(4-aminophenyl)tetramethylsiloxane, bis(4-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane and bis(γ-aminopropyl)tetraphenyldisiloxane.

The silicone diamine also includes the following structure.

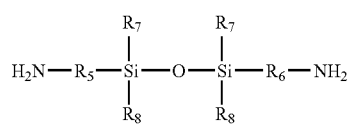

wherein $R_5$ and $R_6$ each represents a divalent organic group, and $R_7$ and $R_8$ each represents a monovalent organic group. The divalent organic group represented by $R_5$ and $R_6$ includes a linear or branched alkylene group having a carbon number of 1 to 20, which may have a substituent, a phenylene group having a carbon number of 6 to 20, a divalent alicyclic group having a carbon number of 3 to 20, and a group comprising a combination thereof. The monovalent organic group represented by $R_7$ and $R_8$ includes a linear or branched alkyl group having a carbon number of 1 to 20, which may have a substituent, and an aryl group having a carbon number of 6 to 20.

Specific examples of the structure include the followings.

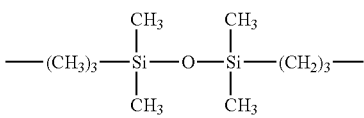

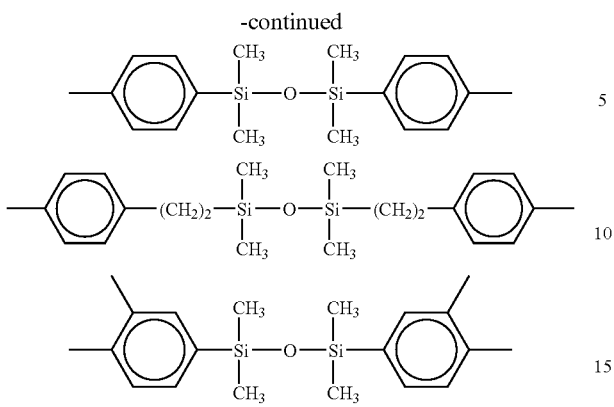

The alicyclic group is preferably an alicyclic group having a carbon number of 3 to 20. Among such alicyclic groups, the following structures are more preferred.

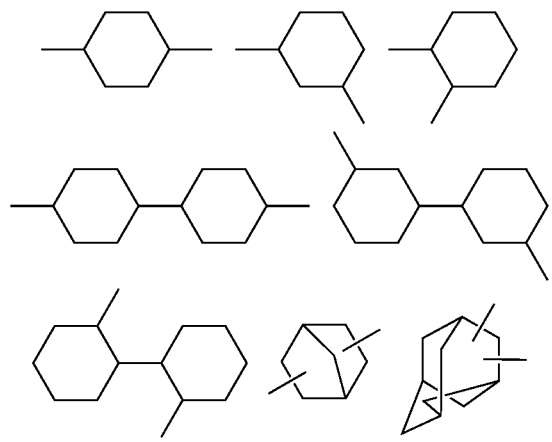

The compound having the structure of (C) includes a compound where $Ar_3$ is an aromatic group, heterocyclic group or aliphatic group selected from the followings.

Examples of the aromatic group and heterocyclic group include the followings.

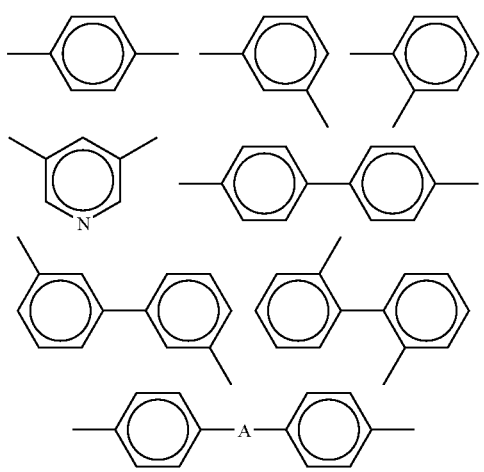

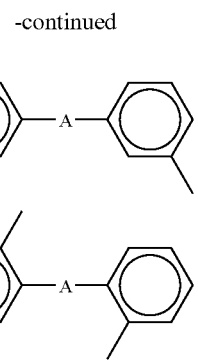

(wherein A indicates a divalent group selected from the group consisting of —$CH_2$—, —O—, —S—, —$SO_2$—, —CO—, —NHCO— and —$C(CF_3)_2$—).

The aliphatic group includes a linear, branched or cyclic divalent structure having a carbon number of 1 to 20. Among such structures, preferred are the following structures which are a cyclic aliphatic group having a carbon number of 3 to 15.

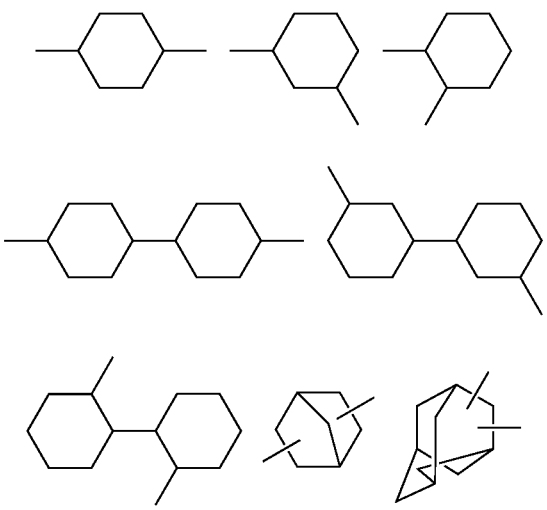

From the standpoint of storability, the terminal of the polymer above is preferably blocked by G in formula (I). G represents a monovalent organic group bonded through a carbonyl group or a sulfonyl group, and the organic group represented by G preferably has at least one carboxyl, ester, alkenyl or alkynyl group. When the terminal group becomes a polymerization site at the cure-heating, this is preferred because the physical properties of the cured film are enhanced.

More specifically, after synthesizing a polyamide (not containing G) working out to the basis of the structure represented by formula (I), the terminal amino group contained in the polyamide resin is preferably capped as an amido by using an acid anhydride or acid derivative bonded through a carbonyl group or a sulfonyl group. Specific preferred examples of the group represented by G include, but are not limited to, the followings.

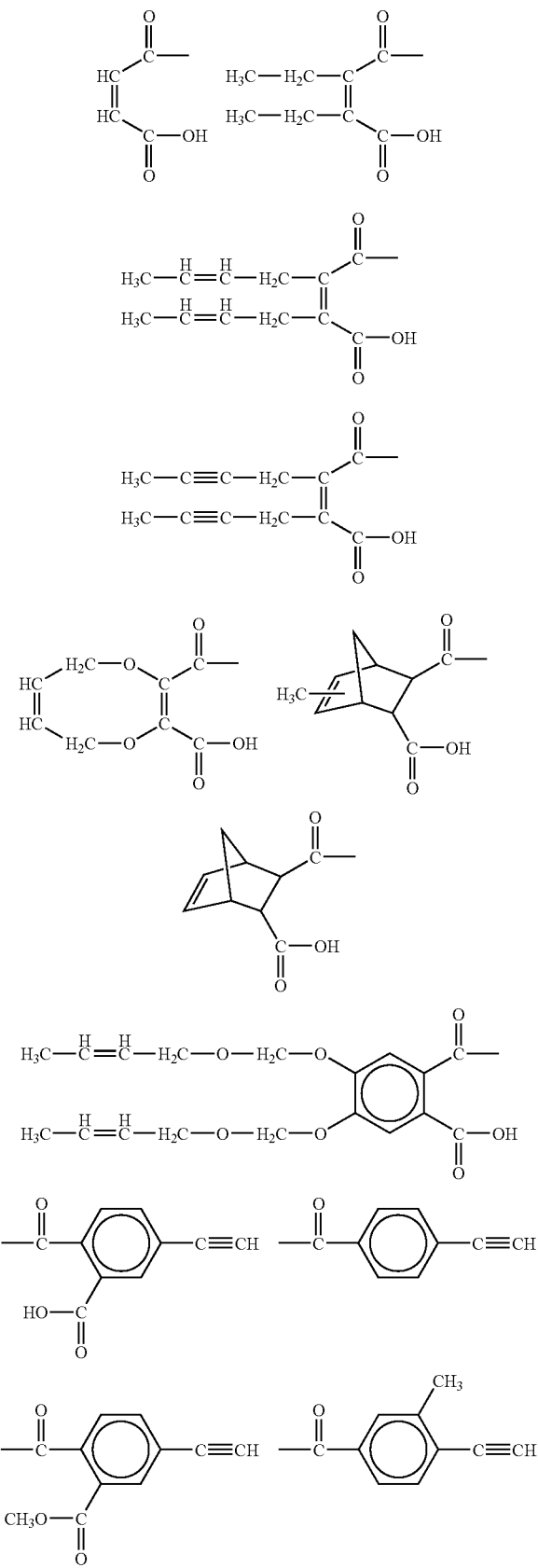
Among these, the groups selected from the followings are more preferred. Two or more kinds of these groups may be used.
The present invention is not limited to the method above, and the terminal acid contained in the polyamide resin may be capped as an amido by using an amine derivative containing an aliphatic group or cyclic compound group having at least one alkenyl or alkynyl group.

The group protecting the hydroxyl group of the polymer above is not particularly limited as long as it is an organic group capable of protecting the hydroxyl group.

As regards the reaction for protecting the hydroxyl group, a reaction of forming an ether bond or an ester bond can be applied.

The protective group includes an alkyl group having a carbon number of 1 to 20 (e.g., methyl, ethyl, propyl, butyl, hexyl, octyl, dodecyl, benzyl), an acyl group having a carbon number of 1 to 10 (e.g., acetyl, propionyl, butyryl, octanoyl, benzoyl), an alkoxycarbonyl group having a carbon number of 2 to 10 (e.g., methoxycarbonyl, ethoxycarbonyl, tert-butoxycarbonyl), and a carbamoyl group having a carbon number of 1 to 10 (e.g., N,N-dimethylcarbamoyl, N,N-diethylcarbamoyl, morpholin-4-ylcarbonyl).

Furthermore, the protective group is preferably a group capable of decomposing under the action of an acid (acid-decomposable group), and a group which decomposes to produce a group having a pKa smaller than that of the hydroxyl group before protection is more preferred, because a difference can be created between the dissolution rate of exposed area and the dissolution rate of unexposed area. Also, for adjusting the dissolution rate of the polymer, a mixture of an acid-decomposable group and a non-acid-decomposable group may be used.

Preferred acid-decomposable groups include the following formulae.

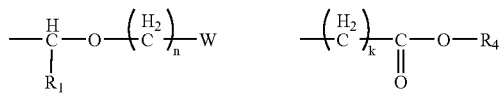

wherein $R_1$ represents an alkyl group having a carbon number of 1 to 4, W represents a linear, branched or cyclic alkyl group having a carbon number of 1 to 10, n represents an integer of 1 to 4, $R_4$ represents a liner, branched or cyclic alkyl group having a carbon number of 4 to 10, and k represents an integer of 0 to 4.

The acid-decomposable group is more preferably a group where in the left formula, W is a linear, branched or cyclic alkyl group having a carbon number of 1 to 6 and n is 1 or 2, or a group where in the right formula, $R_4$ is a linear, branched or cyclic alkyl group having a carbon number of 4 to 6 and k is 0 or 1.

The protective group is preferably a protective group capable of decomposing under heating at 150 to 350° C.

The protective group capable of decomposing under heating at 150 to 350° C is not particularly limited as long as it is a group which decomposes at this temperature, but an alkylcarbonyl group, an alkylsulfonyl group and a substituted carbonyl group are preferred. The alkyl group here is a linear, branched or cyclic alkyl group having a carbon number of 1 to 20, which may have a substituent.

Preferred substituents include a halogen atom, a hydroxyl group, a cyano group, a nitro group and a phenyl group. Also, the thermal stability can be adjusted by the carbon number of a substituent on the carbon close to the carbonyl or sulfonyl group or the carbon number of an alkyl group.

Preferred examples of the alkylcarbonyl group include a methylcarbonyl group, an ethylcarbonyl group, an n-propylcarbonyl group, an i-propylcarbonyl group, an n-butylcarbonyl group, an octylcarbonyl group, a hexadecanylcarbonyl group and a cyclohexylcarbonyl group.

Preferred examples of the alkylsulfonyl group include a methylsulfonyl group, an ethylsulfonyl group, an n-propylsulfonyl group, an i-propylsulfonyl group, an n-butylsulfonyl group, an i-butylsulfonyl group, an octylsulfonyl group, a hexadecanylsulfonyl group and a cyclohexylsulfonyl group.

The substituted carbonyl group is represented by —CO—NH—R or —CO—N(—R)$_2$, wherein R is an aliphatic group, a substituted aliphatic group, an aromatic group, a heteroaromatic group, a substituted aromatic group or a substituted heteroaromatic group. In particular, —CO—N(—R)$_2$ is preferred. Here, the aliphatic group may have a cyclic structure or a branched structure. The number of carbon atoms in the aliphatic group is preferably from 1 to 30, more preferably from 1 to 20, still more preferably from 1 to 15, yet still more preferably from 1 to 10, and most preferably from 1 to 6. The aliphatic group may have a substituent. Examples of the substituent include an aliphatic group having a carbon number of 1 to 4, an alkoxy group having a carbon number of 1 to 4, a cycloalkyl group having a carbon number of 6 to 12, a hydroxyl group, a carboxyl group, a cyano group and a nitro group. The number of carbon atoms in the aromatic hydrocarbon group is preferably from 6 to 30, more preferably from 6 to 20. The aromatic hydrocarbon group may have a substituent. Examples of the substituent are the same as those of the substituent of the substituted aromatic group and substituted heteroaromatic group. The heterocyclic group preferably has a 5- or 6-membered heterocyclic ring. The heterocyclic ring may be condensed with another heterocyclic ring, an aliphatic ring or an aromatic ring. The heteroatom of the heterocyclic ring is preferably a nitrogen atom, an oxygen atom or a sulfur atom. The heterocyclic group may have a substituent. Examples of the substituent of the heterocyclic group are the same as those of the substituent of the substituted aromatic group and substituted heteroaromatic group. Preferred substituted carbamoyl groups include, but are not limited to, N,N-dimethylcarbamoyl group, N,N-diethylcarbamoyl group, N,N-dipropylcarbamoyl group, N,N-dibutylcarbamoyl group and N,N-diphenylcarbamoyl group.

The polymer for use in the present invention is preferably a polymer obtained by protecting a resin where the dissolution rate of an unprotected polymer in a 2.38 mass % aqueous solution (23° C.) of tetramethylammonium hydroxide (TMAH) is 0.1 μm/sec or more. Also, the resin is preferably protected such that the dissolution rate of the resin in an aqueous 2.38 mass % TMAH solution becomes 0.04 μm/sec or less after the protection.

The protection ratio is preferably from 0.5 to 50 mol %, more preferably from 0.5 to 30 mol %, still more preferably from 0.5 to 20 mol %, based on all hydroxyl groups in the polymer. If the protection ratio is excessively high, there arises a problem, for example, the adhesion to substrate decreases or the reduction in the weight of the film at the curing increases, and this is not preferred. If the resin is not protected at all, the effect of the present invention cannot be obtained.

(2) Photosensitizing Agent

The photosensitizing agent for use in the present invention indicates a compound which imparts a function of forming an image upon exposure to the photosensitizing agent and/or triggers the formation of an image. The photosensitizing agent specifically includes a compound capable of generating an acid upon exposure (photoacid generator), and a photosensitive quinonediazide or dihydropyridine compound. Two or more species of these sensitizing agents may be used in combination. Also, for adjusting the sensitivity, a sensitizer and the like may be used in combination. Preferred photosensitizing agents are a photoacid generator and a photosensitive naphthoquinone-diazide.

As for the photoacid generator, a photoinitiator for photo-cationic polymerization, a photoinitiator for photoradical polymerization, a photo-decoloring agent for coloring matters, a photo-discoloring agent, a known compound capable of generating an acid upon irradiation with actinic rays or radiation, which is used for microresist and the like, or a mixture thereof may be appropriately selected and used.

Examples thereof include diazonium salt, phosphonium salt, sulfonium salt, iodonium salt, imidosulfonate, oxime sulfonate, diazodisulfone, disulfone and o-nitrobenzyl sulfonate.

Also, a compound where a group or compound capable of generating an acid upon irradiation with actinic rays or radiation is introduced into the polymer main or side chain, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Among the compounds capable of generating an acid upon irradiation with actinic rays or radiation, the compounds represented by the following formulae (ZI), (ZII) and (ZIII) are preferred.

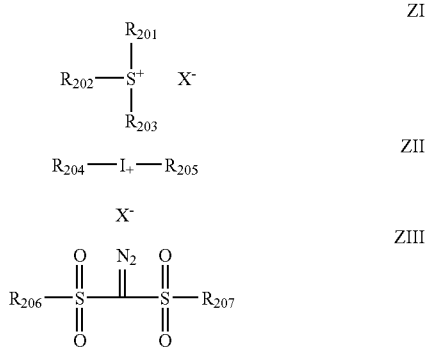

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

Preferred organic anions include the organic anions represented by the following formulae:

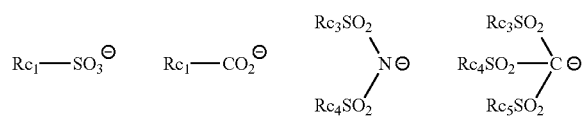

In the formulae, $Rc_1$ represents an organic group.

The organic group of $Rc_1$ includes an organic group having a carbon number of 1 to 30, and preferred examples thereof include an alkyl group which may be substituted, a cycloalkyl group, an aryl group, and a group where a plurality of such groups are connected through a single bond or a linking group such as —O—, —$CO_2$—, —S—, —$SO_3$— and —$SO_2N(Rd_1)$-.

$Rd_1$, represents a hydrogen atom or an alkyl group.

$Rc_3$, $Rc_4$ and $Rc_5$ each independently represents an organic group.

Preferred organic groups of $Rc_3$, $Rc_4$ and $Rc_5$ are the same as the preferred organic groups of $Rb_1$, and a perfluoroalkyl group having a carbon number of 1 to 4 is preferred.

$Rc_3$ and $Rc_4$ may combine to form a ring.

The group formed resulting from $Rc_3$ and $Rc_4$ being combined includes an alkylene group, a cycloalkylene group and an arylene group, and a perfluoroalkylene group having a carbon number of 2 to 4 is preferred.

The organic group of $Rc_1$ and $Rc_3$ to $Rc_5$ is preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light increases and the sensitivity is enhanced. Also, when $Rc_3$ and $Rc_4$ are combined to form a ring, this is preferred because the acidity of the acid generated upon irradiation with light increases and the sensitivity is enhanced.

In formula (ZI), the carbon number of the organic group of $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed resulting from two members out of $R_{201}$ to $R_{203}$ being combined include an alkylene group (e.g., butylene, pentylene).

Specific examples of the organic group of $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or one or two of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an organic group having no aromatic ring. The aromatic ring as used herein includes an aromatic ring containing a heteroatom.

The aromatic ring-free organic group of $R_{201}$ to $R_{203}$ has a carbon number of generally from 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group of $R_{201}$ to $R_{203}$ may be either linear or branched and is preferably a linear or branched alkyl group having a carbon number of 1 to 10 (e.g., methyl, ethyl, propyl, butyl, pentyl). The alkyl group of $R_{201}$ to $R_{203}$ is more preferably a linear or branched 2-oxoalkyl group or an alkoxycarbonylmethyl group.

The cycloalkyl group of $R_{201}$ to $R_{203}$ is preferably a cycloalkyl group having a carbon number of 3 to 10 (e.g., cyclopentyl, cyclohexyl, norbornyl). The cycloalkyl group of $R_{201}$ to $R_{203}$ is more preferably a cyclic 2-oxoalkyl group.

The linear, branched or cyclic 2-oxoalkyl group of $R_{201}$ to $R_{203}$ is preferably a group having >C=O at the 2-position of the alkyl group or cycloalkyl group above.

The alkoxy group in the alkoxycarbonylmethyl group of $R_{201}$ to $R_{203}$ is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

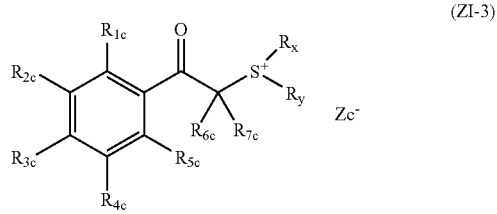

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, the pair of $R_{6c}$ and $R_{7c}$, or the pair of $R_x$ and $R_y$ may combine with each other to form a ring structure, and the ring structure may contain an oxygen atom, a sulfur atom, an ester bond or an amido bond. Examples of the group formed resulting from any two or more members out of $R_{1c}$ to $R_{5c}$, the pair of $R_{6c}$ and $R_{7c}$ or the pair of $R_x$ and $R_y$ being combined include a butylene group and a pentylene group.

$Zc^-$ represents a non-nucleophilic anion, and examples thereof are the same as those of the non-nucleophilic anion of $X^-$ in formula (ZI).

The alkyl group of $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl).

The cycloalkyl group of $R_{1c}$ to $R_{7c}$ is preferably a cycloalkyl group having a carbon number of 3 to 8 (e.g., cyclopentyl, cyclohexyl).

The alkoxy group of $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. In this case, the solubility in a solvent is more enhanced and generation of particles during storage can be suppressed.

Examples of the alkyl group of $R_x$ and $R_y$ are the same as those of the alkyl group of $R_{1c}$ to $R_{7c}$. The alkyl group of $R_x$ and $R_y$ is preferably a linear or branched 2-oxoalkyl group or an alkoxycarbonylmethyl group.

Examples of the cycloalkyl group of $R_x$ and $R_y$ are the same as those of the cycloalkyl group of $R_{1c}$ to $R_{7c}$. The cycloalkyl group of $R_x$ to $R_y$ is preferably a cyclic 2-oxoalkyl group.

Examples of the linear, branched or cyclic 2-oxoalkyl group include a group having >C=O at the 2-position of the alkyl group or cycloalkyl group of $R_{1c}$ to $R_{7c}$.

Examples of the alkoxy group in the alkoxycarbonylmethyl group are the same as those of the alkoxy group of $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably an aryl group such as phenyl group and naphthyl group, or a heteroaryl group such as indole residue and pyrrole residue, more preferably a phenyl group or an indole residue.

The alkyl group of $R_{204}$ to $R_{207}$ may be linear or branched and is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (ZI).

Among the compounds capable of generating an acid upon irradiation with actinic rays or radiation, preferred are the compounds represented by the following formulae (ZIV), (ZV) and (ZVI):

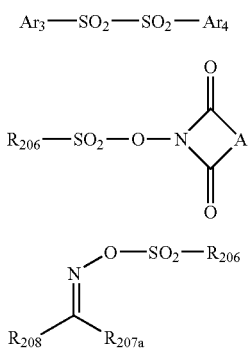

In formulae (ZIV) to (ZVI), $Ar_3$ and $Ar_4$ each independently represents an aryl group.

$R_{206}$ represents an alkyl group, a cycloalkyl group or an aryl group.

$R_{207a}$ and $R_{208}$ each independently represents an alkyl group, a cycloalkyl group, an aryl group, or an electron-withdrawing group. $R_{207a}$ is preferably an aryl group. $R_{208}$ is preferably an electron-withdrawing group, more preferably a cyano group or a fluoroalkyl group.

A represents an alkylene group, an alkenylene group, or an arylene group.

Among the compounds capable of generating an acid upon irradiation with actinic rays or radiation, more preferred are the compounds represented by formulae (ZI) to (ZIII).

Among the compounds capable of generating an acid upon irradiation with actinic rays or radiation, still more preferred is a compound having a triphenylsulfonium cation structure.

Particularly preferred examples of the compound capable of generating an acid upon irradiation with actinic rays or radiation are set forth below.

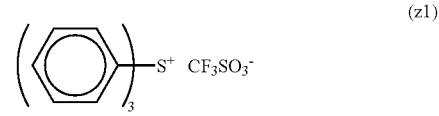

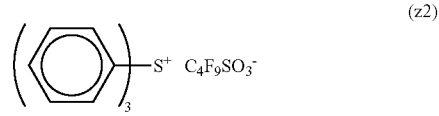

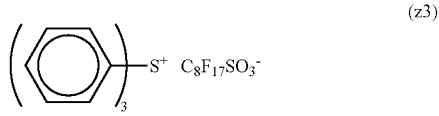

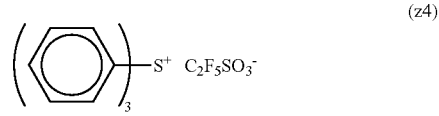

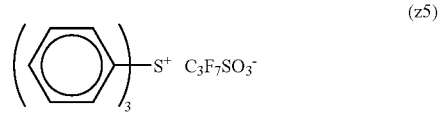

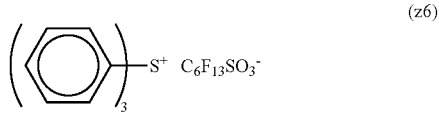

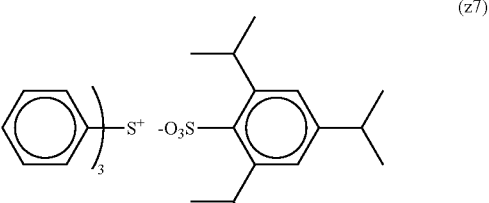

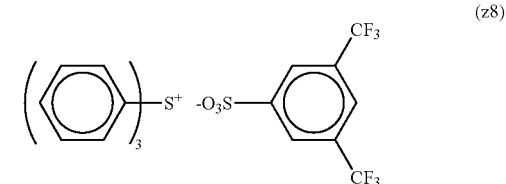

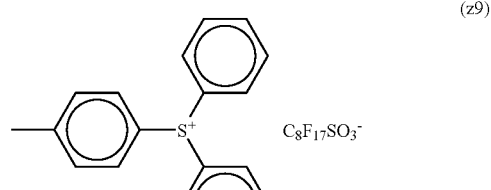

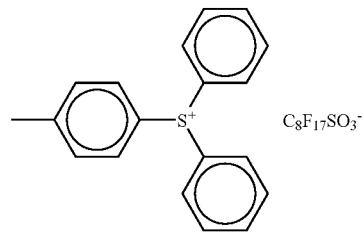

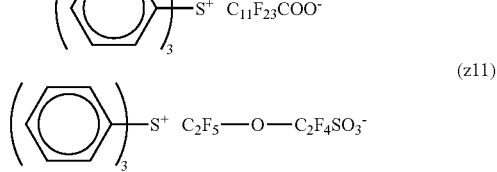

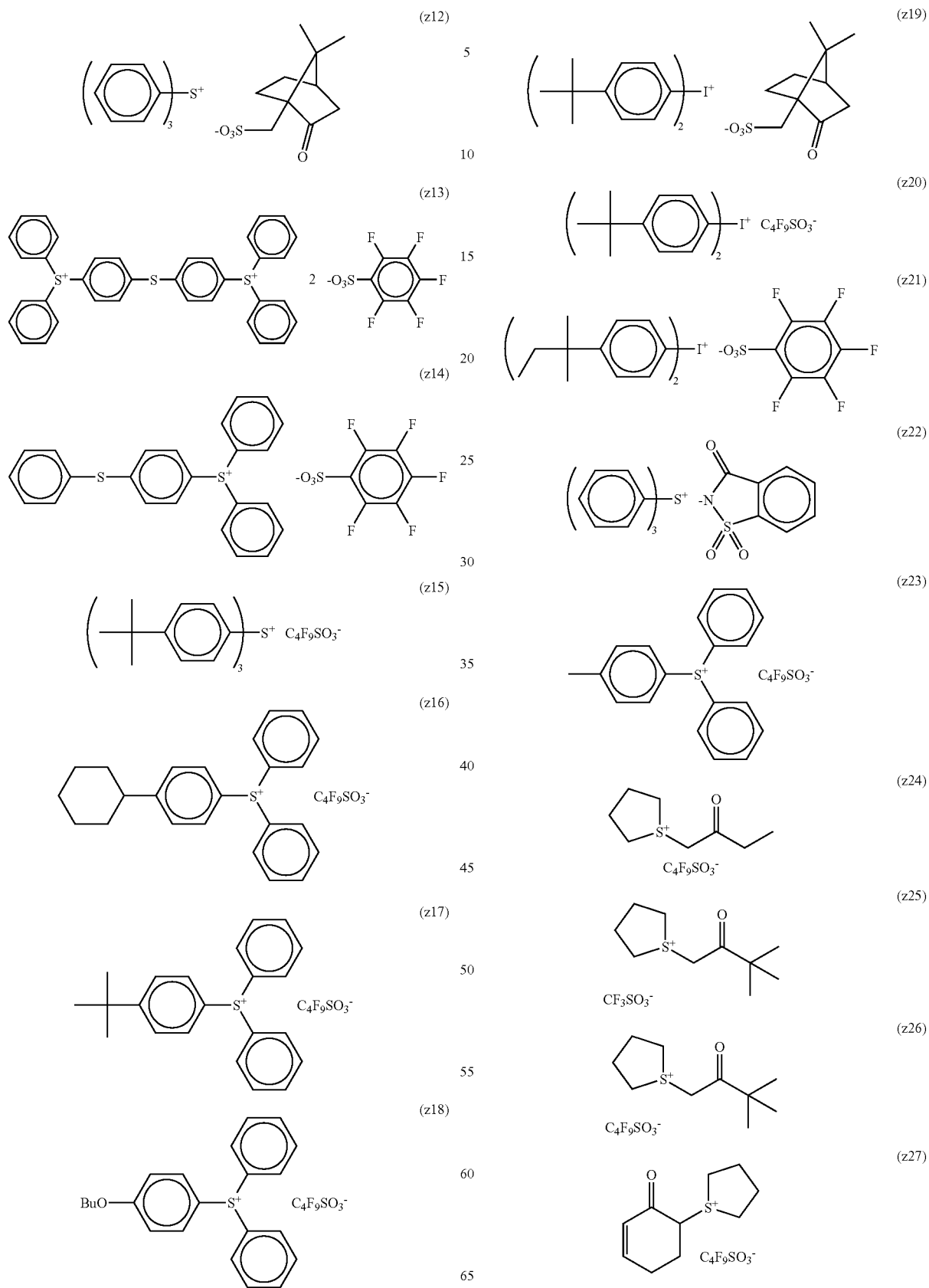

-continued
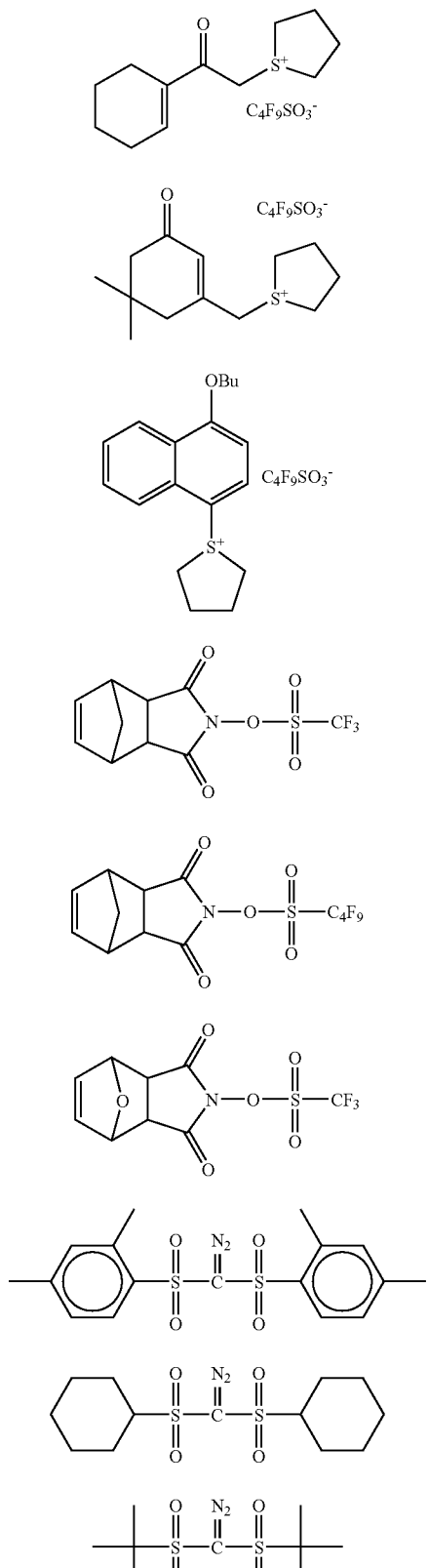
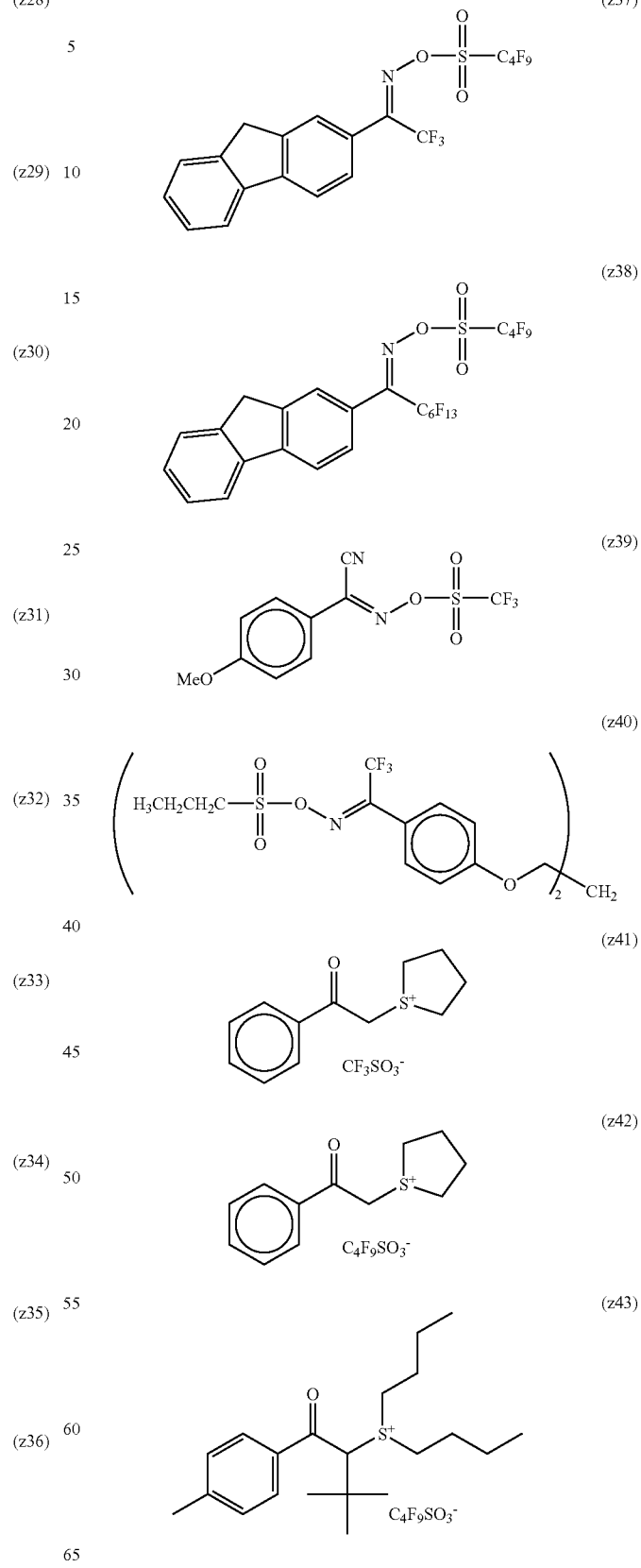

-continued
(z44)
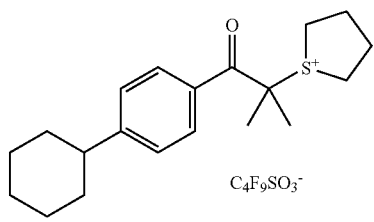
(z45)
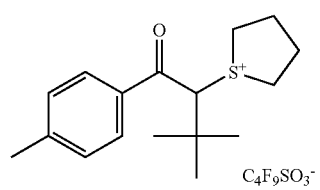
(z46)
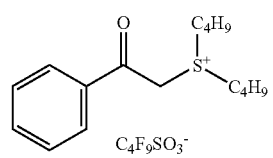
(z47)
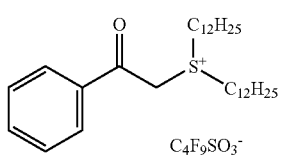
(z48)
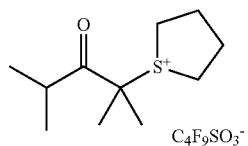
(z49)
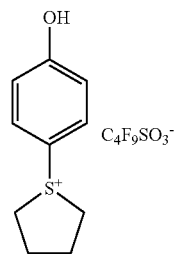
(z50)
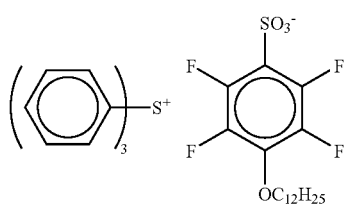
(z51)
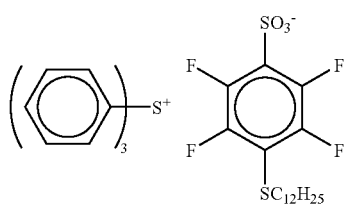
-continued
(z52)
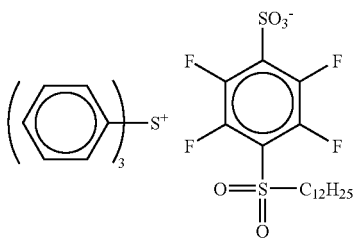
(z53)
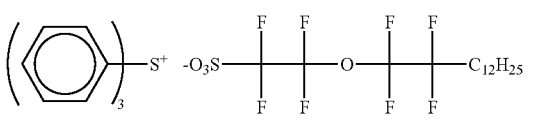
(z54)
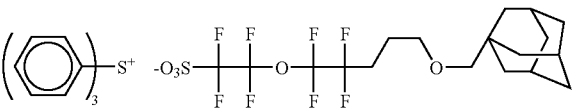
(z55)
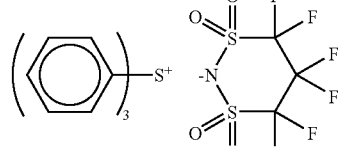
(z56)
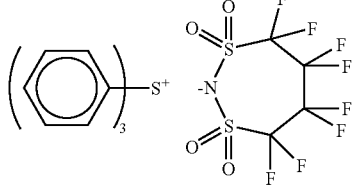
(z57)
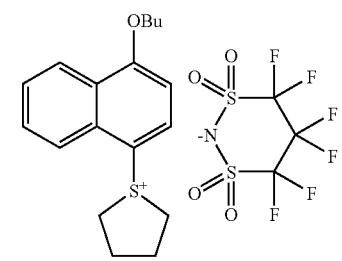
(z58)
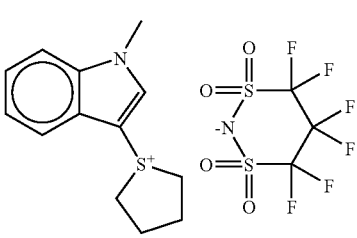
(z59)
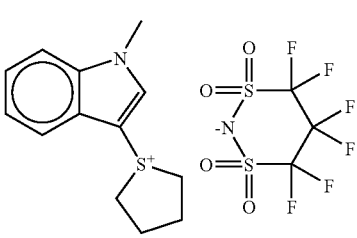

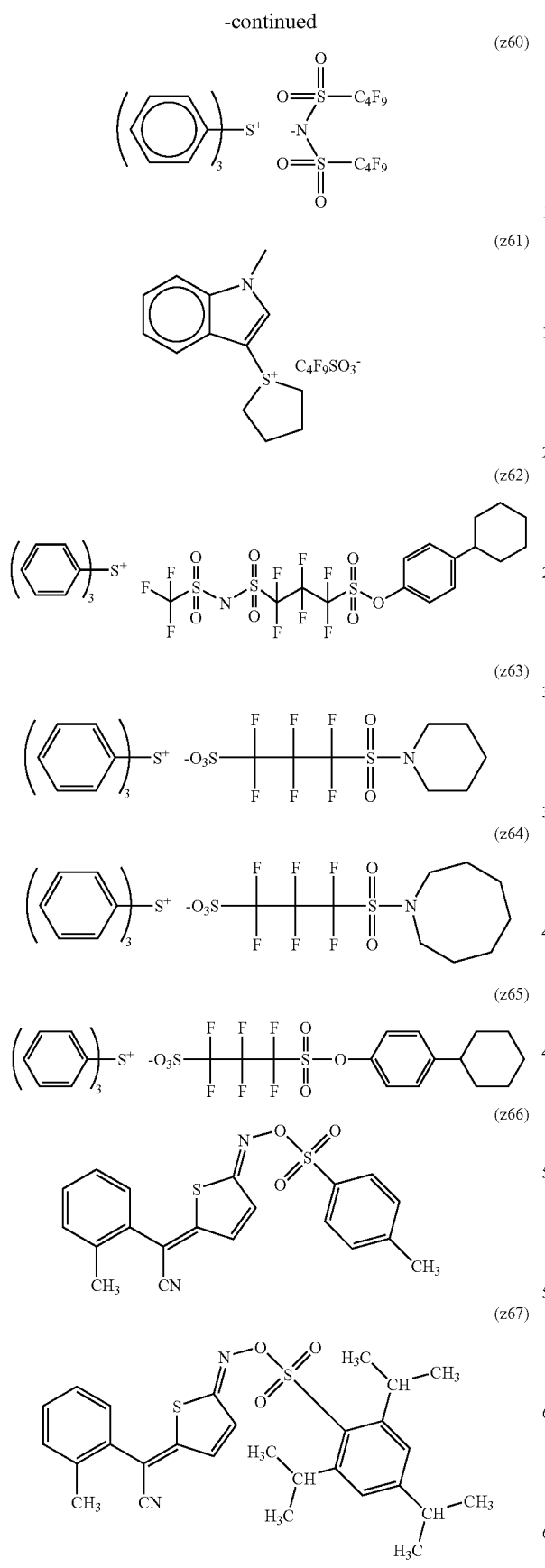
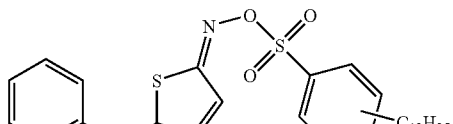

One of these acid generators may be used alone, or two or more species thereof may be used in combination. In the case of using two or more species in combination, compounds capable of generating two kinds of organic acids differing in the total atom number except for hydrogen atom by 2 or more are preferably combined.

The content of the acid generator is preferably from 0.1 to 20 mass %, more preferably from 0.5 to 10 mass %, still more preferably from 1 to 8 mass %, based on the entire solid content of the photosensitive resin composition.

Furthermore, in the case of using a photoacid generator having no absorption of exposure light, a sensitizer is preferably used in combination.

The sensitizer absorbs actinic rays or radiation and enters an electron excited state. The sensitizer in an electron excited state comes into contact with the photoacid generator to cause an action such as electron transfer, energy transfer and heat generation, as a result, the photoacid generator undergoes a chemical change and decomposes to produce a radical, an acid or a base. Preferred examples of the sensitizer include compounds having absorption at a wavelength in the region of 350 to 450 nm and belonging to the following compounds:

polynuclear aromatics (e.g., pyrene, perylene, triphenylene, anthracene), xanthenes (e.g., fluorescein, eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, methylene blue, toluidine blue), acridines (e.g., acridine orange, chloroflavin, acriflavine), anthraquinones (e.g., anthraquinone), squaryliums (e.g., squarylium) and coumarins (e.g., 7-diethylamino-4-methylcoumarin).

More preferred examples of the sensitizer include the compounds represented by the following formulae (IX) to (XIV):

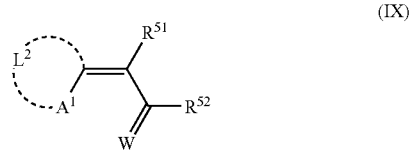

(IX)

In formula (IX), $A^1$ represents a sulfur atom or $NR^{50}$, $R^{50}$ represents an alkyl group or an aryl group, $L^2$ represents a nonmetallic atom group necessary for forming a basic nucleus of the dye in cooperation with the adjacent $A^1$ and adjacent carbon atom, $R^{51}$ and $R^{52}$ each independently represents a hydrogen atom or a monovalent nonmetallic atom group, $R^{51}$ and $R^{52}$ may combine with each other to form an acidic nucleus of the dye, and W represents an oxygen atom or a sulfur atom.

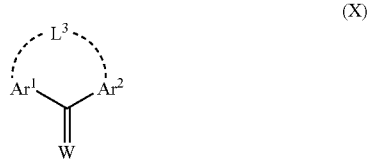

(X)

In formula (X), $Ar_1$ and $Ar_2$ each independently represents an aryl group and are connected through a bond of $-L^3-$, $L^3$ represents $—O—$ or $—S—$, and W has the same meaning as in formula (IX).

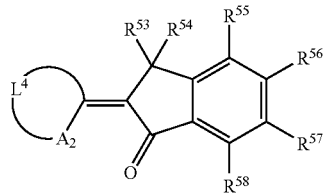

(XI)

In formula (XI), $A_2$ represents a sulfur atom or $NR^{59}$, $L^4$ represents a nonmetallic atom group necessary for forming a basic nucleus of the dye in cooperation with the adjacent $A^2$ and adjacent carbon atom, $R^{53}$, $R^{54}$, $R^{55}$, $R^{56}$, $R^{57}$ and $R^{58}$ each independently represents a monovalent nonmetallic atom group, and $R^{59}$ represents an alkyl group or an aryl group.

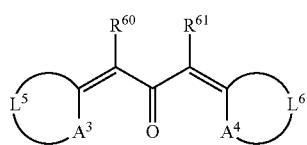

(XII)

In formula (XII), $A^3$ and $A^4$ each independently represents $—S—$, $—NR^{62}—$ or $—NR^{63}—$, $R^{62}$ and $R^{63}$ each independently represents an alkyl group or an aryl group, $L^5$ and $L^6$ each independently represents a nonmetallic atom group necessary for forming a basic nucleus of the dye in cooperation with the adjacent $A^3$ or $A^4$ and adjacent carbon atom, and $R^{60}$ and $R^{61}$ each independently represents a hydrogen atom or a monovalent nonmetallic atom group or may combine with each other to form an aliphatic or aromatic ring.

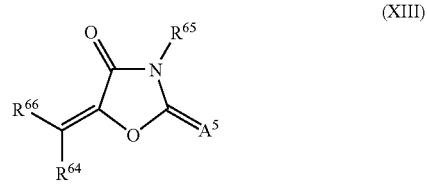

(XIII)

In formula (XIII), $R^{66}$ represents an aromatic or heterocyclic ring which may have a substituent, $A^5$ represents an oxygen atom, a sulfur atom or $—NR^{67}—$, $R^{64}$, $R^{65}$ and $R^{67}$ each independently represents a hydrogen atom or a monovalent nonmetallic atom group, and $R^{67}$ and $R^{64}$, or $R^{65}$ and $R^{67}$ may combine with each other to form an aliphatic or aromatic ring.

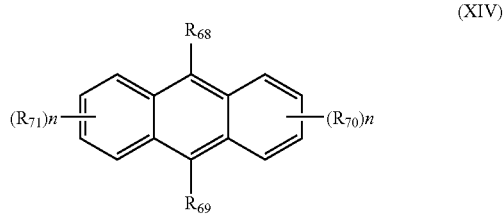

(XIV)

In formula (XIV), $R_{68}$ and $R_{69}$ each independently represents a hydrogen atom or a monovalent nonmetallic atom group, $R_{70}$ and $R_{71}$ each independently represents a monovalent nonmetallic atom group, n represents an integer of 0 to 4, and when n is 2 or more, $R_{70}$ and $R_{71}$ may combine with each other to form an aliphatic or aromatic ring.

The sensitizer is preferably an anthracene derivative.

Specific preferred examples of the compounds represented by formulae (IX) to (XIV) include, but are not limited to, the following compounds (C-1) to (C-26).

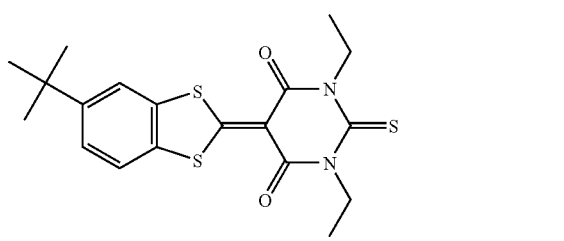

(C-1)

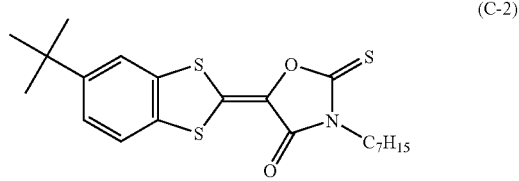

(C-2)

-continued
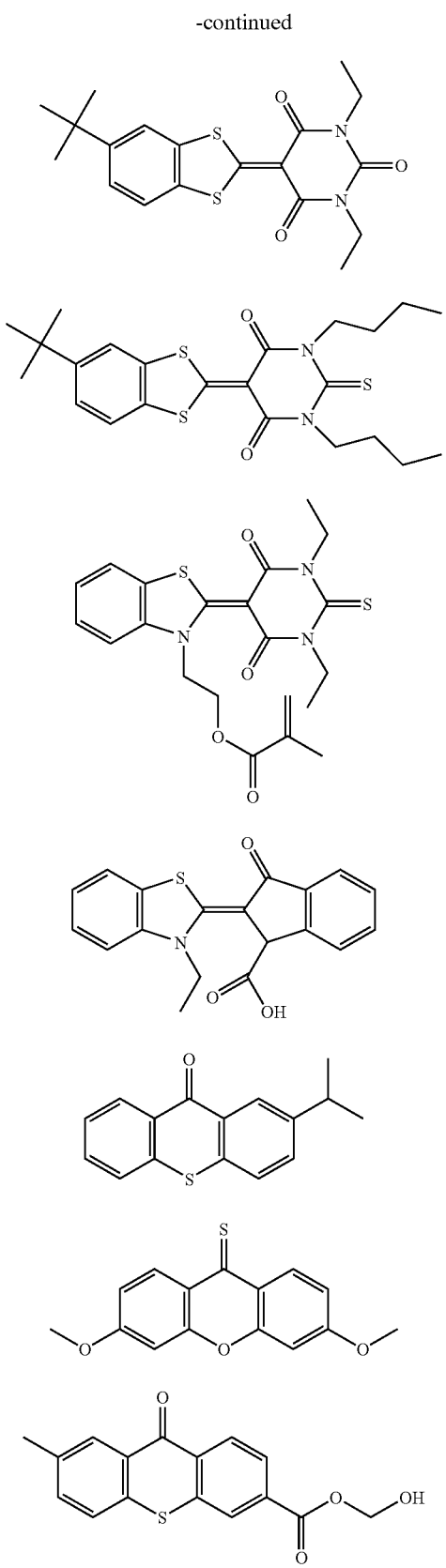
(C-3)
(C-4)
(C-5)
(C-6)
(C-7)
(C-8)
(C-9)
-continued
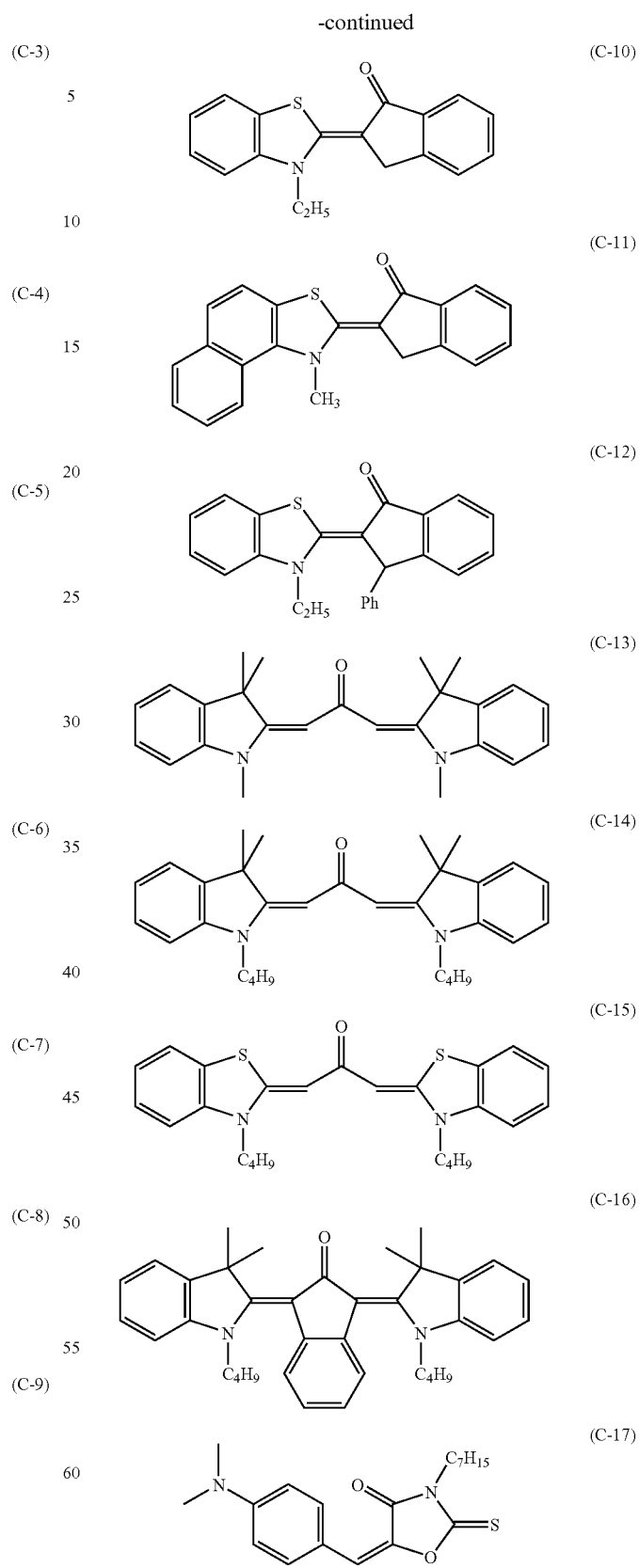
(C-10)
(C-11)
(C-12)
(C-13)
(C-14)
(C-15)
(C-16)
(C-17)

-continued (C-18) 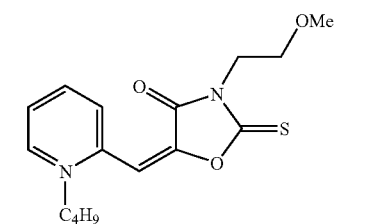

(C-19) 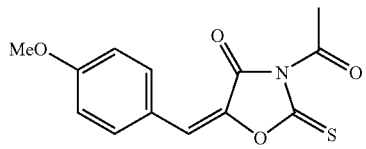

(C-20) 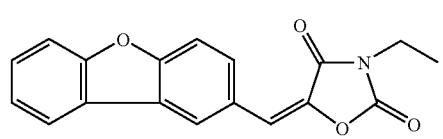

(C-21) 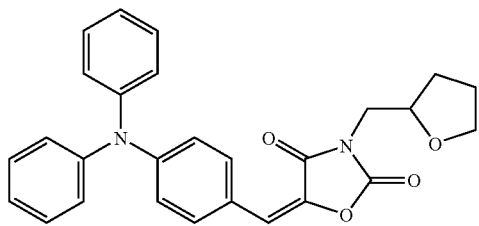

(C-22) 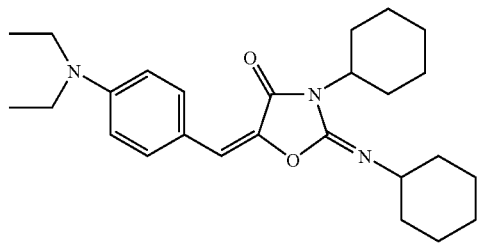

(C-23) 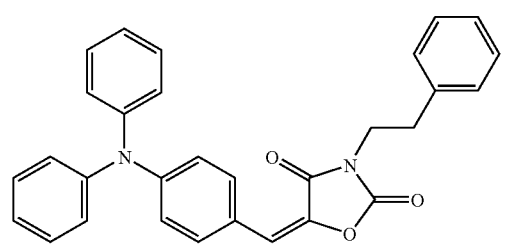

(C-24) 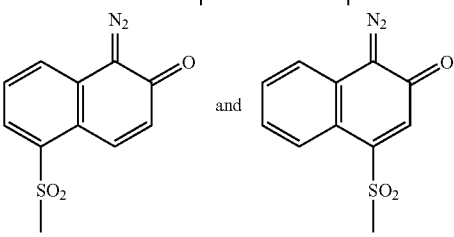

-continued (C-25) 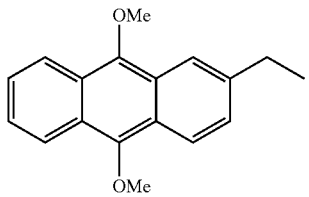

(C-26) 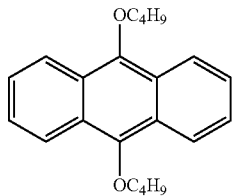

The above-described sensitizer may be a commercially available product or may be synthesized by a known synthesis method.

The amount of the sensitizer added is generally from 1 to 100 parts by mass, preferably from 5 to 70 parts by mass, more preferably from 10 to 50 parts by mass, per 100 parts by mass of the photoacid generator.

The photosensitive naphthoquinonediazide compound for use in the present invention includes a quinonediazidesulfonic acid ester of a low molecular phenol compound. As for the quinonediazidesulfonyl group, the followings are preferred.

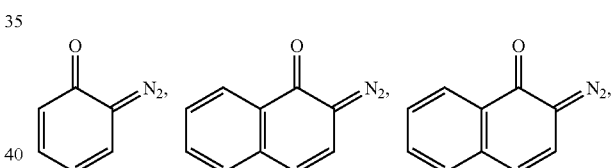

The low molecular phenol compound is generally a phenol compound having a molecular weight of 150 to 1,500.

In the photosensitizing agent, the esterification ratio of the phenolic hydroxyl group by a quinonediazidesulfonic acid group is preferably from 30 to 100%, more preferably from 50 to 100%.

The low molecular phenol compound for the photosensitizing agent is preferably a phenol compound represented by any one of the following formulae (A1) to (A4), more preferably a phenol compound represented by formula (A4).

The phenol compounds represented by formulae (A1) to (A4) are described.

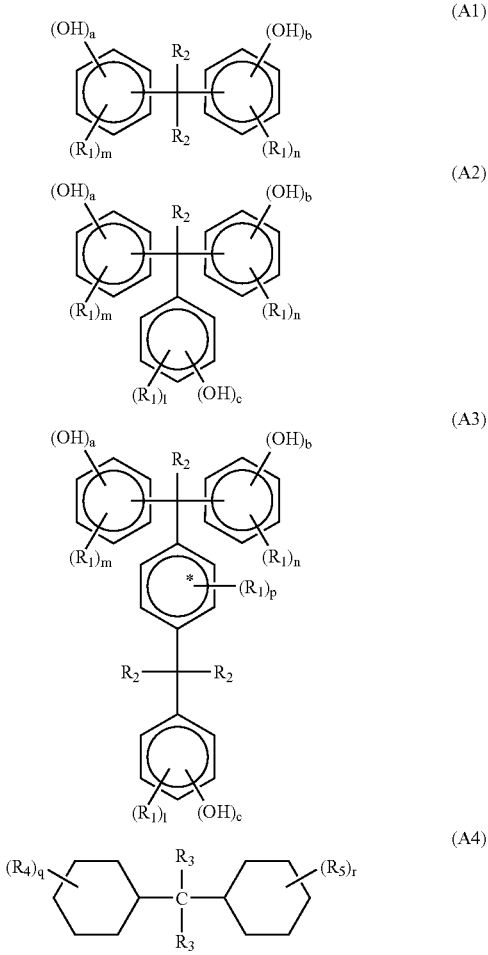

In formulae (A1) to (A3), $R_1$ independently represents an alkyl group, a cyclic alkyl group, an alkoxy group, an alkenyl group, an aryl group, an aralkyl group, a halogen atom, an acyl group, an acyloxy group or an alkoxycarbonyl group.

$R_2$ independently represents an alkyl group, a cyclic alkyl group, an alkenyl group, an aryl group or an aralkyl group, and a plurality of $R_2$'s may combine with each other to form a ring. The group formed resulting from two different $R_2$'s being combined includes an alkylene group.

a to c each independently represents an integer of 1 to 3.

l, m, n and p each represents a number of 0 to 3.

When a to c each is 2 or 3, l, m and n each represents a number of 0 to 2.

In formula (A4), $R_3$ independently represents a hydrogen atom or an alkyl group.

$R_4$ and $R_5$ each independently represents an alkyl, alkoxy, aryl or cyclic alkyl group having at least one hydroxyl group.

q and r each independently represents an integer of 1 to 3.

Details of each substituent above are as follows.

The alkyl group is preferably a linear or branched alkyl group having a carbon number of 1 to 15, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group and a nonyl group.

The cyclic alkyl group may be monocyclic or polycyclic. The monocyclic type is preferably a cyclic alkyl group having a carbon number of 3 to 8, and examples thereof include a cyclopropyl group, a cyclobutyl group, a cyclopentyl group, a cyclohexyl group and a cyclooctyl group. The polycyclic type is preferably a cyclic alkyl group having a carbon number of 6 to 20, and examples thereof include an adamantyl group, a norbornyl group, an isobornyl group and a camphornyl group.

The aryl group is preferably an aryl group having a carbon number of 6 to 16, and examples thereof include a phenyl group, a naphthyl group, a phenanthryl group and a pyrenyl group.

The aralkyl group is preferably an aralkyl group having a carbon number of 7 to 12, and examples thereof include a benzyl group, a phenethyl group and a naphthylmethyl group.

The alkoxy group is preferably a linear or branched alkoxy group having a carbon number of 1 to 15, and examples thereof include a methoxy group, an ethoxy group, a propoxy group, an isopropoxy group, an n-butoxy group, an isobutoxy group, a sec-butoxy group, a tert-butoxy group, a hexyloxy group, a heptyloxy group, an octyloxy group and a nonyloxy group.

Examples of the halogen atom include a fluorine atom, a chlorine atom, a bromine atom and an iodine atom.

The acyl group is preferably an acyl group having a carbon number of 1 to 15, and examples thereof include an acetyl group, a propionyl group, a pivaloyl group, a butyryl group, a valeryl group, a palmitoyl group and a benzoyl group.

The acyloxy group is preferably an acyloxy group having a carbon number of 1 to 15, and examples thereof include an acetoxy group, a methylbutynoyloxy group, a methyldecynoyloxy group, a propionyloxy group, a butyryloxy group, a valeryloxy group, a palmitoyloxy group and a benzoyloxy group.

The alkoxycarbonyl group is preferably an alkoxycarbonyl group having a carbon number of 2 to 15, and examples thereof include a methoxycarbonyl group, an ethoxycarbonyl group, a butoxycarbonyl group, an octyloxycarbonyl group and a dodecyloxycarbonyl group.

The alkenyl group is preferably an alkenyl group having a carbon number of 2 to 8, and examples thereof include a vinyl group, an allyl group, a butenyl group and a cyclohexenyl group.

The alkylene group is preferably an alkylene group having a carbon number of 2 to 15, more preferably an alkylene group having a carbon number of 2 to 8.

These groups each may be further substituted by a group similar to the above (preferably a monovalent group having a carbon number of 10 or less).

In formula (A4), $R_4$ and $R_5$ each is preferably a group represented by the following formula (X).

$R_6$ independently represents a hydrogen atom, a halogen atom, an alkyl group, an alkoxy group, an aryl group or a cycloalkyl group.

s represents an integer of 1 to 3.

a represents an integer of 1 to 3.

Specific examples of the phenol compounds represented by formulae (A1) to (A4) are set forth below, but the present invention is not limited thereto.

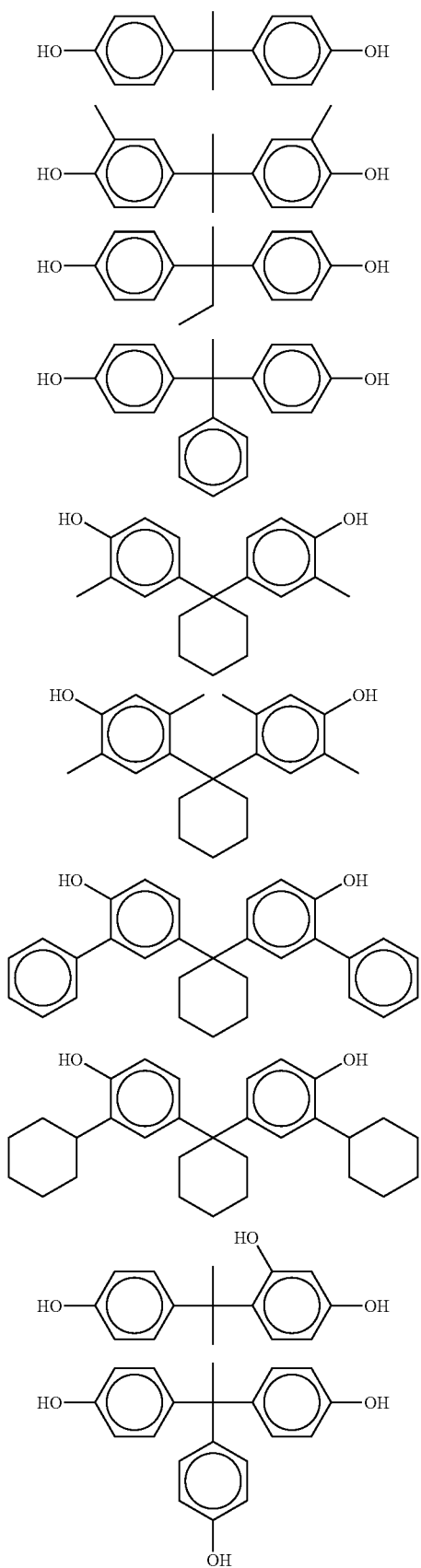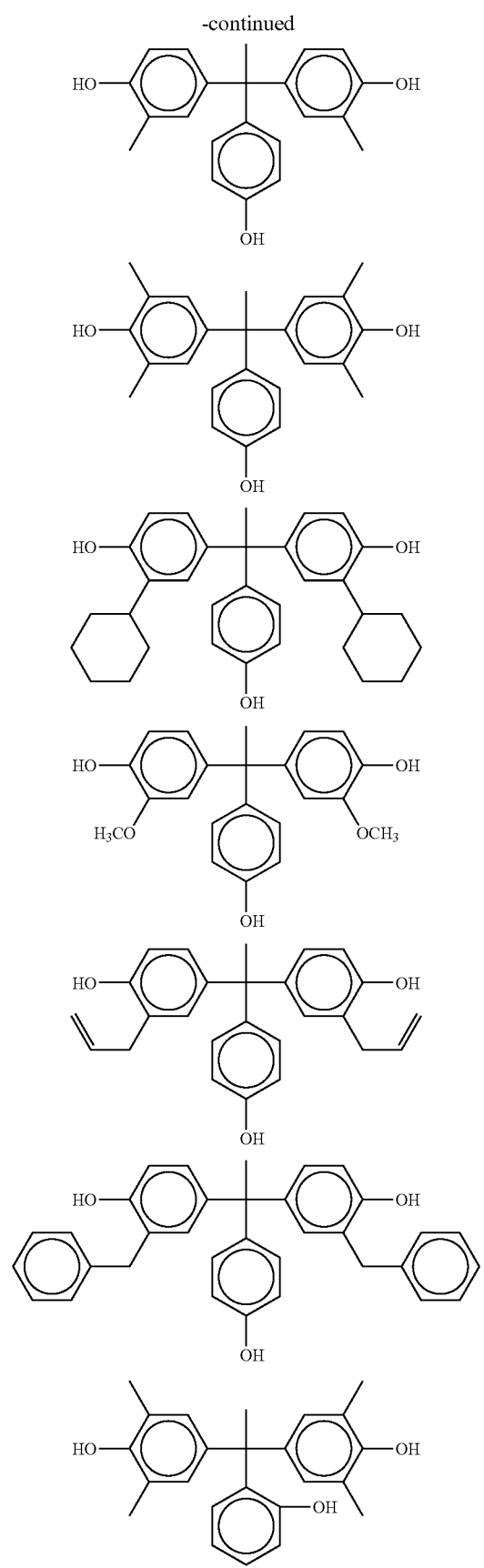

-continued
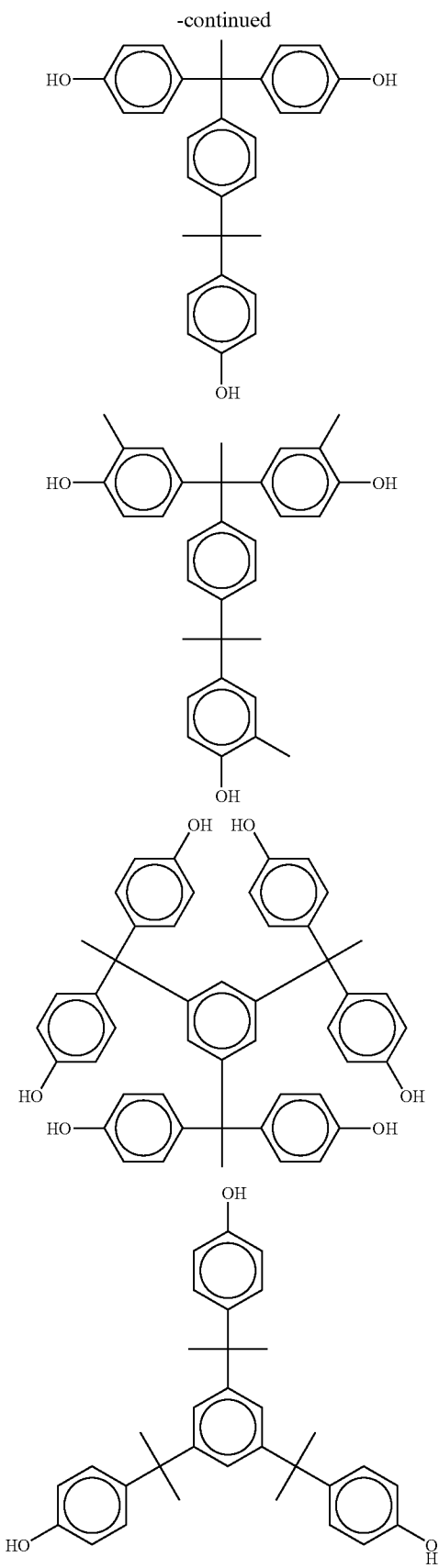
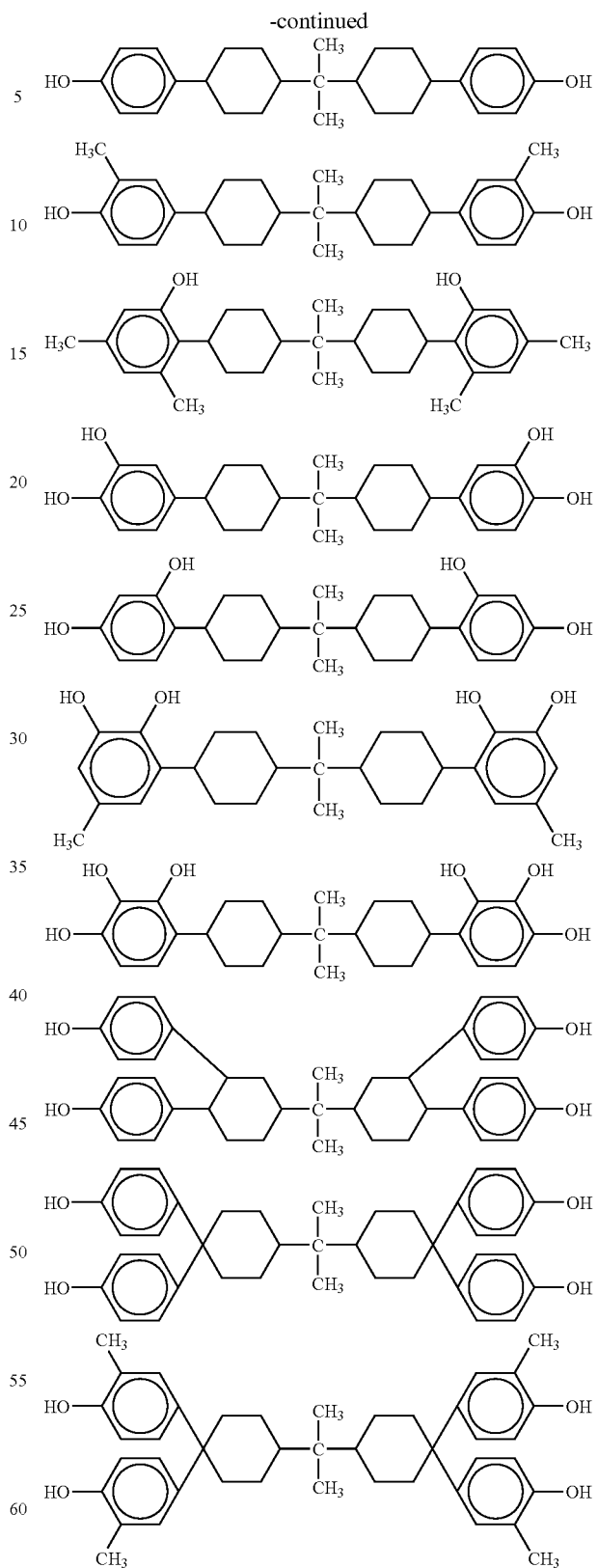
The low molecular phenol compound for the photosensitizing agent also includes a phenol compound represented by formula (A5).

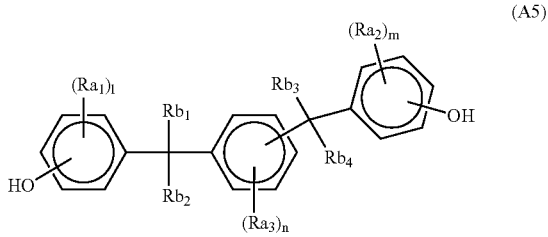

(A5)

$R_{a1}$ to $R_{a3}$ each independently represents an alkyl group, a cyclic alkyl group, an aryl group, an aralkyl group, an alkoxy group, a halogen atom, an acyl group, an acyloxy group, an alkoxycarbonyl group or an alkenyl group.

$R_{b1}$ to $R_{b4}$ each independently represents an alkyl group. $R_{b1}$ and $R_{b2}$, or $R_{b3}$ and $R_{b4}$ may combine with each other to form a ring.

l, m and n each independently represents an integer of 0 to 3.

The alkyl group of $R_{a1}$ to $R_{a3}$ is preferably a linear or branched alkyl group having a carbon number of 1 to 15, and examples thereof include a methyl group, an ethyl group, a propyl group, an isopropyl group, an n-butyl group, an isobutyl group, a sec-butyl group, a pentyl group, a neopentyl group and a hexyl group.

The cyclic alkyl group is preferably a cycloalkyl group having a carbon number of 3 to 30, and examples thereof include a cyclopropyl group, a cyclopentyl group, a cyclohexyl group, an adamantyl group, a norbornyl group and a boronyl group.

The aryl group is preferably an aryl group having a carbon number of 6 to 16, and examples thereof include a phenyl group, a naphthyl group and a phenanthryl group.

The aralkyl group is preferably an aralkyl group having a carbon number of 7 to 12, and examples thereof include a benzyl group, a phenethyl group and a naphthylmethyl group.

The alkoxy group is preferably a linear or branched alkoxy group having a carbon number of 1 to 30, and examples thereof include a methoxy group, an ethoxy group, a propoxy group, an isopropoxy group, an n-butoxy group, an isobutoxy group, a sec-butoxy group, a tert-butoxy group and a hexyloxy group.

Examples of the halogen atom include a fluorine atom, a chlorine atom, a bromine atom and an iodine atom.

The acyl group is preferably an acyl group having a carbon number of 1 to 30, and examples thereof include an acetyl group, a propionyl group, a pivaloyl group, a butyryl group and a valeryl group.

The acyloxy group is preferably an acyloxy group having a carbon number of 1 to 30, and examples thereof include an acetoxy group, a methylbutynoyloxy group, a methyldecynoyloxy group, a propionyloxy group, a butyryloxy group, a valeryloxy group, a palmitoyloxy group and a benzoyloxy group.

The alkoxycarbonyl group is preferably an alkoxycarbonyl group having a carbon number of 1 to 30, and examples thereof include a methoxycarbonyl group, an ethoxycarbonyl group, a butoxycarbonyl group and an octyloxycarbonyl group.

The alkenyl group is preferably an alkenyl group having a carbon number of 2 to 8, and examples thereof include a vinyl group, an allyl group, a butenyl group and a cyclohexenyl group.

The alkyl group of $R_{b1}$ to $R_{b4}$ is the same as the alkyl group of $R_{a1}$ to $R_{a3}$ and preferably has a carbon number of 1 to 10, more preferably a carbon number of 1 to 5.

$R_{b1}$ and $R_{b2}$, or $R_{b3}$ and $R_{b4}$ may combine with each other to form a ring. Specific examples of the ring include a 3- to 6-membered ring such as cyclohexane ring.

These groups each may further have a substituent. Examples of the substituent which the groups may further have include an alkoxy group, a cycloalkyl group, an acyl group, an acyloxy group, a halogen atom, a hydroxyl group and a carboxyl group. As for the ring structure, examples of the substituent further include an alkyl group.

Specific examples of the phenol compound represented by formula (A5) are set forth below, but the present invention is not limited thereto.

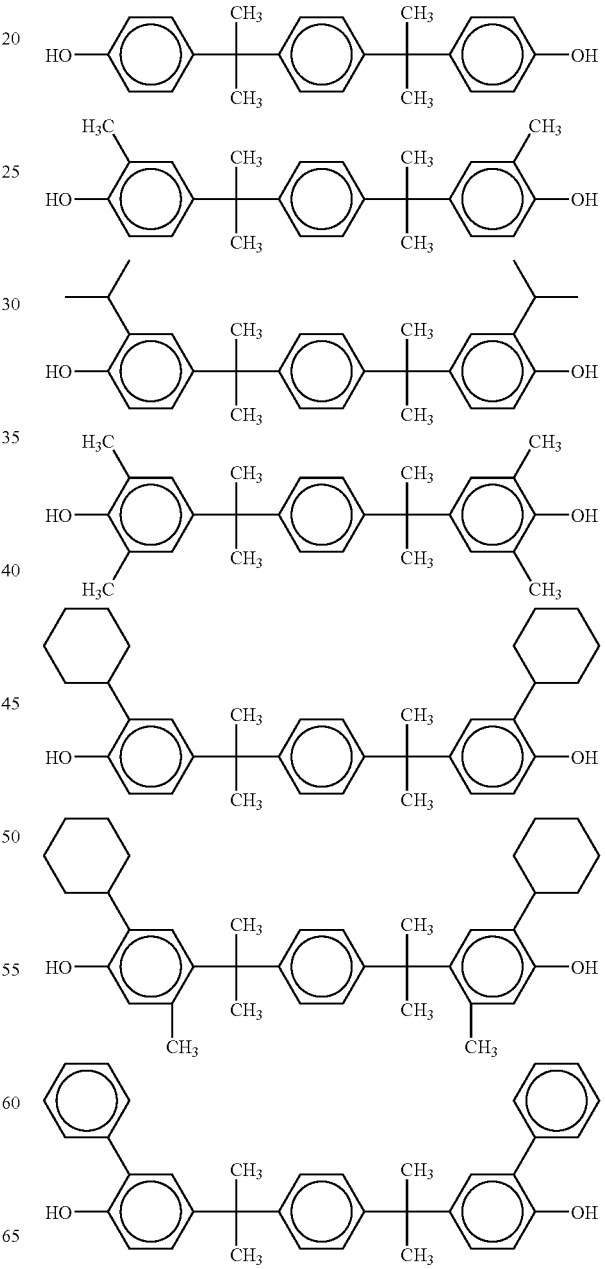

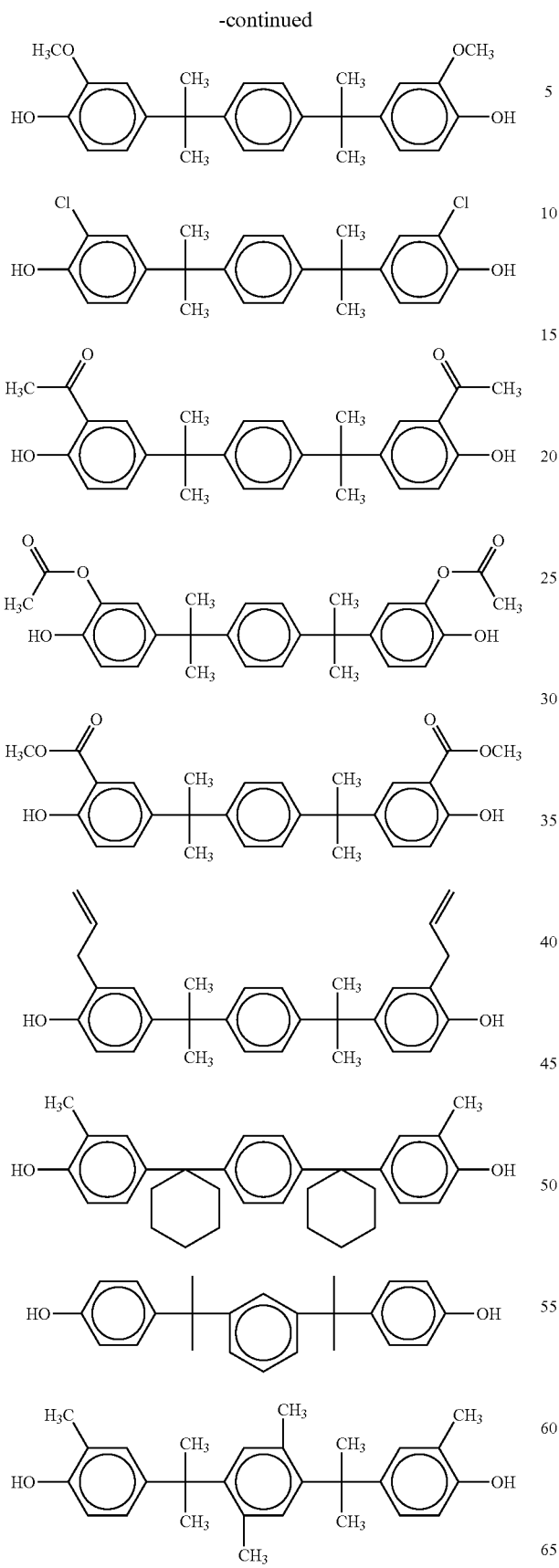

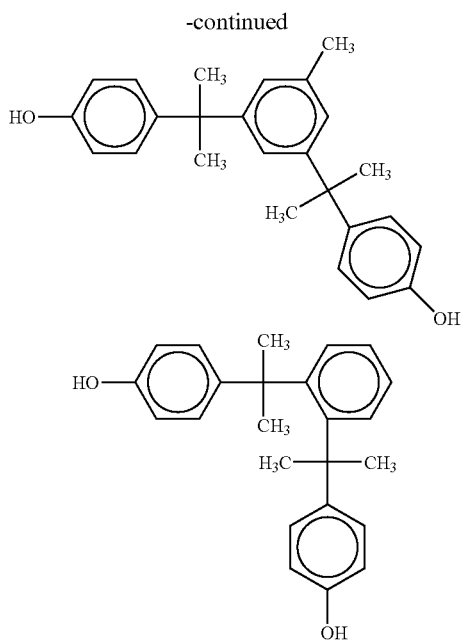

The low molecular phenol compound further includes a phenol compound represented by formula (A6).

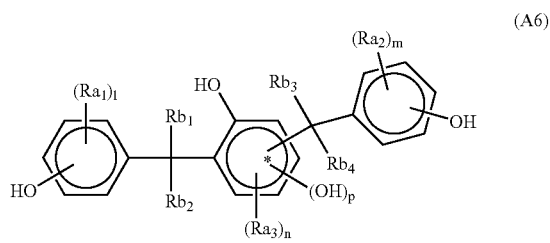

$R_{a1}$ to $R_{a3}$ each independently represents an alkyl group, a cyclic alkyl group, an aryl group, an aralkyl group, an alkoxy group, a halogen atom, an acyl group, an acyloxy group, an alkoxycarbonyl group or an alkenyl group.

$R_{b1}$ to $R_{b4}$ each independently represents an alkyl group. $R_{b1}$ and $R_{b2}$, or $R_{b3}$ and $R_{b4}$ may combine with each other to form a ring.

l, m and n each independently represents an integer of 0 to 3.

p represents 0 or 1, provided that n+p is from 0 to 3.

In formula (A6), the alkyl group, cyclic alkyl group, aryl group, aralkyl group, alkoxy group, halogen atom, acyl group, acyloxy group, alkoxycarbonyl group and alkenyl group of $R_{a1}$ to $R_{a3}$ are the same as those of $R_{a1}$ to $R_{a3}$ in formula (A5).

The alkyl group of $R_{b1}$ to $R_{b4}$ is the same as the alkyl group of $R_{a1}$ to $R_{a3}$ and preferably has a carbon number of 1 to 10, more preferably a carbon number of 1 to 5.

$R_{b1}$ and $R_{b2}$, or $R_{b3}$ and $R_{b4}$ may combine with each other to form a ring. Specific examples of the ring include a 3- to 6-membered ring such as cyclohexane ring.

These groups each may further have a substituent. Examples of the substituent which the groups may further have include an alkoxy group, a cycloalkyl group, an acyl group, an acyloxy group, a halogen atom, a hydroxyl group and a carboxyl group. As for the ring structure, examples of the substituent further include an alkyl group.

p=1 is preferred, and the benzene ring-containing groups substituted to both ends of the benzene ring in the center of formula (A6) are preferably in the relationship of meta-substitution.

Specific examples of the phenol compound represented by formula (A6) are set forth below, but the present invention is not limited thereto.

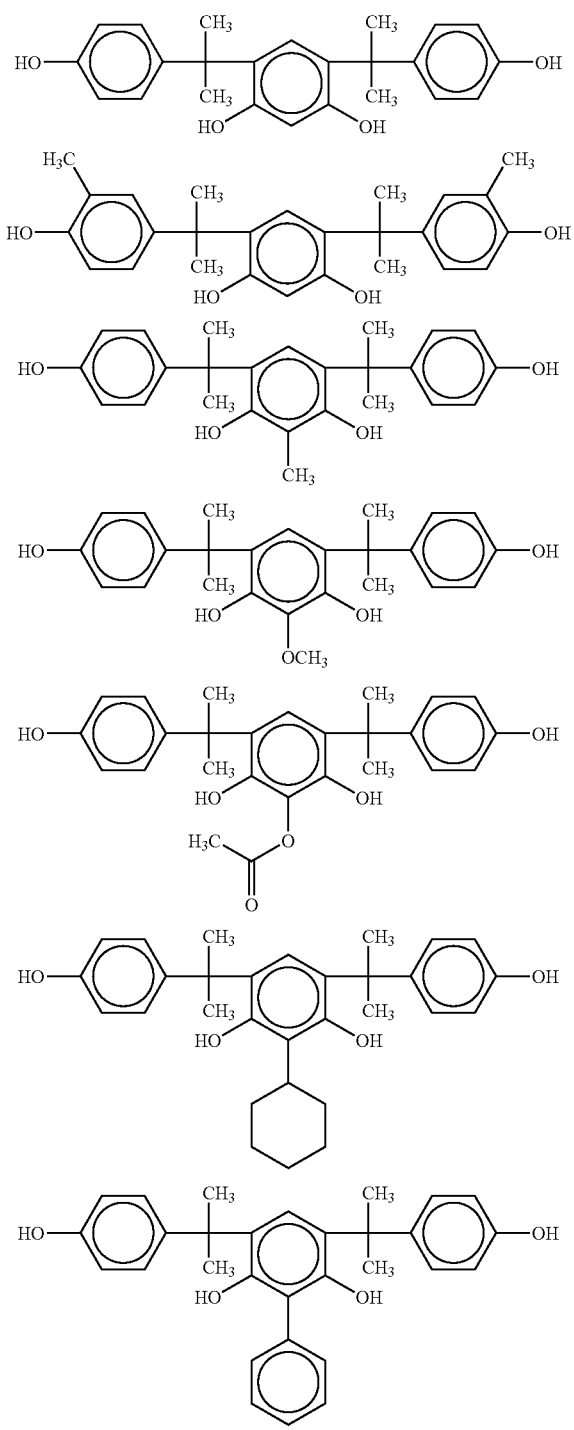

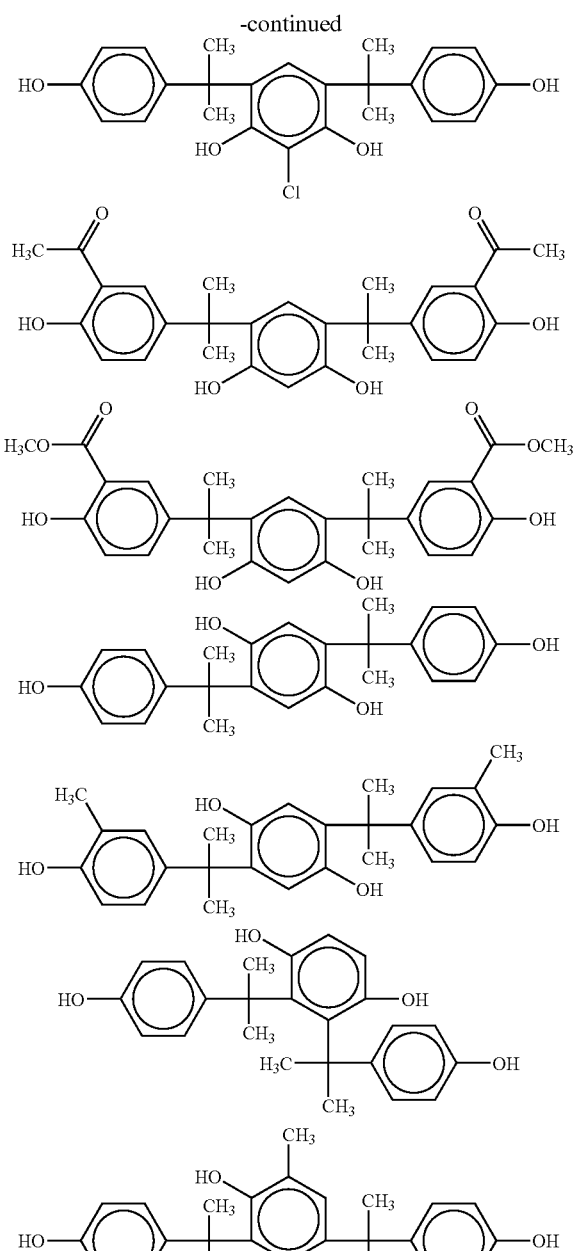

The phenol compound represented by formula (A6) may be a commercially available product or may be synthesized by a known synthesis method.

Esterification of the phenol compound represented by formulae (A1) to (A6) into a quinonediazidesulfonic acid ester may also be performed by a known method.

For example, the ester may be obtained by performing an esterification reaction of the phenol compound represented by any one of formulae (A1) to (A6) and 1,2-naphthoquinonediazide-5-(and/or -4-)sulfonyl chloride in the presence of a basic catalyst.

More specifically, the phenol compound represented by any one of formulae (A1) to (A6), 1,2-naphthoquinonediazide-5-(and/or -4-)sulfonyl chloride and a solvent such as dioxane, acetone, tetrahydrofuran, methyl ethyl ketone, N-methylpyrrolidone, chloroform, trichloroethane, trichloroethylene, dichloroethane or γ-butyllactone are charged into a flask each in a predetermined amount, and a basic catalyst such as sodium hydroxide, sodium carbonate, sodium hydrogencarbonate, triethylamine, 4-dimethylaminopyridine, 4-methylmorpholine, N-methyl-piperazine or N-methylpiperidine is added dropwise thereto to effect the condensation. The reaction temperature is usually from −20 to 60° C., preferably from 0 to 40° C.

The product obtained is crystallized in water, then washed with water, further purified and dried.

The amount of the photosensitizing agent added is generally from 1 to 30 mass %, preferably from 1 to 20 mass %, based on the entire solid content (the total amount of components constituting a cured product finally obtained, excluding the solvent) of the photosensitive resin composition of the invention.

A plurality of these photosensitizing agents may be used in combination. It is also preferred to use a photoacid generator and a quinonediazide compound in combination.

(3) Compound Containing a Methacryloyl or Acryloyl Group within the Molecule

The compound containing a methacryloyl or acryloyl group within the molecule for use in the present invention is a compound selected from the group consisting of an acrylic acid ester and a methacrylic acid ester. This compound is insoluble in an alkali developer and therefore, works to suppress the alkali solubility of the composition and in turn the film loss of the unexposed area, which is advantageous for good image formation. Although the reaction mechanism is not specifically elucidated, the acryl group or methacryl group reacts with the compound in the composition at the stage of curing reaction and the molecular weight of the component constituting the composition partially increases, as a result, the physical properties of the film are enhanced. In this regard, a compound having two or more acryloyl or methacryloyl groups within one molecule is preferred because the compound can exert a function like a crosslinking compound.

Also, a compound where the skeleton containing the acryloyl or methacryloyl group contains a ring structure such as aromatic ring or alicyclic ring, particularly, an alicyclic structure, is more preferred in view of transmittance of the exposure light and rigidity of the cured film.

Furthermore, the length (n) of the ethylene oxide (EO) chain or propylene oxide (PO) chain in the skeleton is preferably n=from 1 to 5, because if the length is large, the film is deprived of rigidity.

Specific preferred examples of the compound include NK Ester Series produced by Shin-Nakamura Chemical Co., Ltd., such as monofunctional AMP-10G, AMP-20GY, AM30G, AM90G, AM230G, ACB-3, A-BH, A-IB, A-SA, A-OC-18E, 720A, S-1800A, ISA, AM-130G, LA, M-20G, M-90G, M230G, PHE-1G, SA, CB-1, CB-3, CB-23, TOPOLENE-M, S-1800M, IB, OC-18E and S; bifunctional A-200, A-400, A-600, A-1000, ABE-300, A-BPE-4, A-BPE-10, A-BPE-20, A-BPE-30, A-BPP-3, A-DOD, A-DCP, A-IBD-2E, A-NPG, 701A, A-B1206PE, A-HD-N, A-NOD-N, APG-100, APG-200, APG-400, APG-700, 1G, 2G, 3G, 4G, 9G, 14G, 23G, BG, BD, HD-N, NOD, IND, BPE-100, BPE-200, BPE-300, BPE-500, BPE-900, BPE-1300N, NPG, DCP, 1206PE, 701, 3PG and 9PG; trifunctional A-9300, AT-30E, A-TMPT-3EO, A-TMPT-9EO, A-TMPT-3PO, A-TMM-3, A-TMM-3L, A-TMM-3LM-N, TMPT and TMPT-9EO; tetrafunctional or greater functional ATM-35E, ATM-4E, AD-TMP, AD-TMP-L, ATM-4P, A-TMMT and A-DPH.

Among these, more preferred are AMP-10G, AMP-20GY, ACB-3, A-IB, 702A, ABE-300, A-BPE-4, A-BPE-10, A-BPE-20, A-BPE-30, A-BPP-3, A-DCP, A-B1206PE, A-9300, PHE-1G, CB-1, CB-3, CB-23, IB, BPE-100, BPE-200, BPE-300, BPE-500, BPE-900, BPE-1300N and DCP.

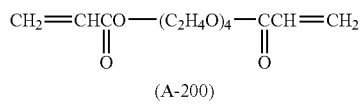

(A-200)

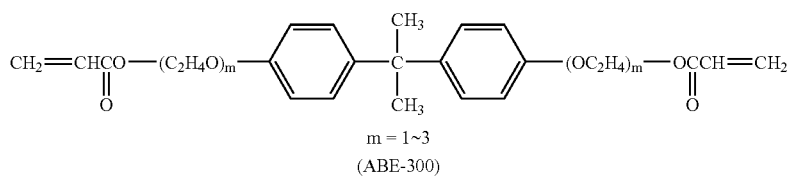

m = 1~3
(ABE-300)

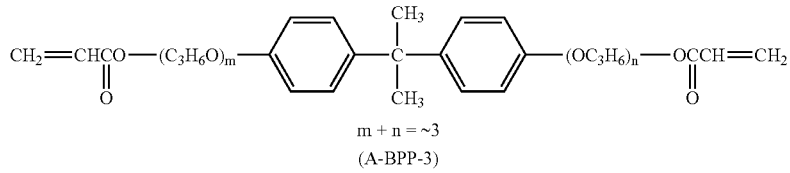

m + n = ~3
(A-BPP-3)

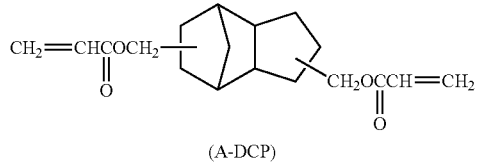

(A-DCP)

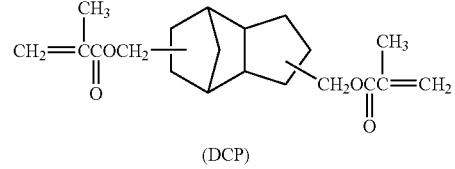

(DCP)

The amount added of the compound containing a methacryloyl or acryloyl group within the molecule for use in the present invention is preferably from 1 to 100 parts by mass, more preferably from 5 to 70 parts by mass, still more preferably from 5 to 50 parts by mass, per 100 parts by mass of the polymer. The effect of the present invention can be obtained by setting the amount added to 1 part by mass or more, and reduction in the heat resistance of the cured film can be prevented by appropriately controlling the amount added.

(4) Solvent

The solvent is not particularly limited as long as it can dissolve the composition of the present invention, but in order not to allow precipitation of solid contents of the composition during coating due to excessive evaporation of the solvent at the coating, a solvent having a boiling point of 100° C. or more is preferred.

The solvent is suitably an organic solvent such as N-methylpyrrolidone (NMP), γ-butyrolactone (GBL), N,N-dimethylacetamide (DMAc), 1,3-dimethyl-2-imidazolidinone (DMI), N,N-dimethylformamide (DMF) and a mixture thereof, but the present invention is not limited thereto. The solvent is preferably γ-butyrolactone or N-methylpyrrolidone, and most preferably γ-butyrolactone.

Furthermore, if the solvent remains in the film after curing, a film having satisfactory physical properties cannot be obtained. Therefore, it is not preferred that a solvent having a high boiling point more than the cure temperature is contained to account for 60 mass % or more in the solvent. Also, a solvent having a low boiling point is not preferred because, as described above, solid matters of the composition may precipitate due to evaporation of the solvent during coating. In this regard, a solvent having a boiling point of 100 to 160° C. and a solvent having a boiling point of 160 to 300° C. are preferably used as a mixture.

More specifically, a mixed solvent containing propylene glycol monoalkyl ether and γ-butyrolactone is preferred, and a mixed solvent where the amount in total of propylene glycol monoalkyl ether and γ-butyrolactone is 70 mass % or more of the total amount of all solvents is more preferred.

The mixing ratio of propylene glycol monoalkyl ether and γ-butyrolactone is preferably from 95/5 to 50/50 in terms of mass ratio.

Examples of the propylene glycol monoalkyl ether include propylene glycol monomethyl ether, propylene glycol monoethyl ether, propylene glycol monopropyl ether and propylene glycol monobutyl ether, with propylene glycol monomethyl ether being preferred.

Furthermore, a mixed solvent comprising γ-butyrolactone, propylene glycol monoalkyl ether and a solvent having a dipolar moment of 3.5 debye or more is preferred Examples of the solvent having a dipolar moment of 3.5 debye or more include N-methyl-2-pyrrolidone, dimethyl sulfoxide, sulfolane, N,N-dimethylformamide, N,N-dimethylacetamide, ε-caprolactam, acetonitrile, acrylonitrile, benzonitrile, butanenitrile, crotonaldehyde, ethylene carbonate, formamide, isobutylnitrile, methacrylonitrile, N-methylacetamide, 4-methylbutanenitrile, N-methylformamide, pentanenitrile, pentaneacetonitrile, propanenitrile, propionenitrile, 2-pyrrolidinone and 1,3-dimethyl-2-imidazole. Among these, N-methyl-2-pyrrolidone, dimethyl sulfoxide and sulfolane are preferred. As for the solvent having a dipolar moment of 3.5 debye or more, one species or two or more species may be used.

(5) Sulfonic Acid Ester

The sulfonic acid ester for use in the present invention is preferably a sulfonic acid ester represented by the following formula. Although the operation mechanism of this compound is not known, the physical properties of the cured film are more improved by its addition in the present invention.

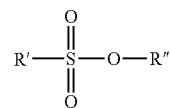

In the formula above, R' and R" each independently represents a linear, branched or cyclic alkyl group having a carbon number of 1 to 10, which may have a substituent, or an aryl group having a carbon number of 6 to 20, which may have a substituent. The substituent includes a hydroxyl group, a halogen atom, a cyano group, a vinyl group, an acetylene group and a liner or cyclic alkyl group having a carbon number of 1 to 10.

The amount added of the sulfonic acid ester for use in the present invention is preferably 30 parts by mass or less, more preferably from 0.5 to 20 parts by mass, per 100 parts by mass of the polymer.

Specific preferred examples of the sulfonic acid ester for use in the present invention includes the followings.

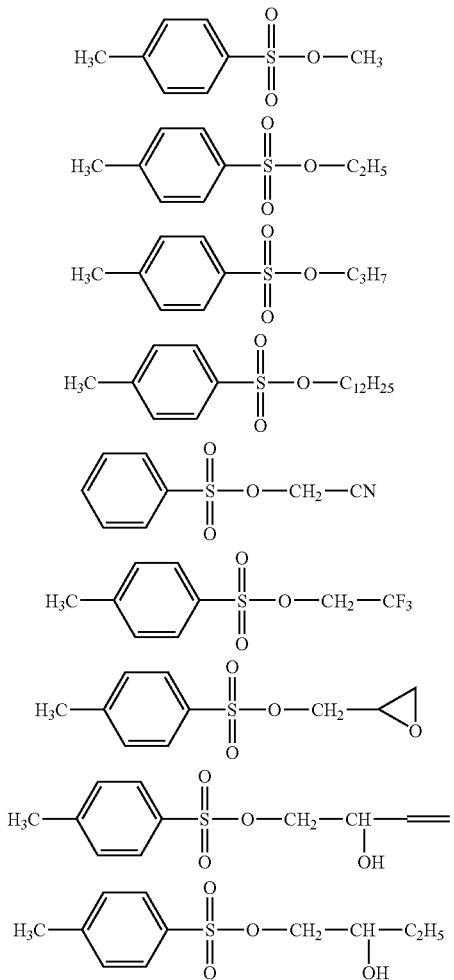

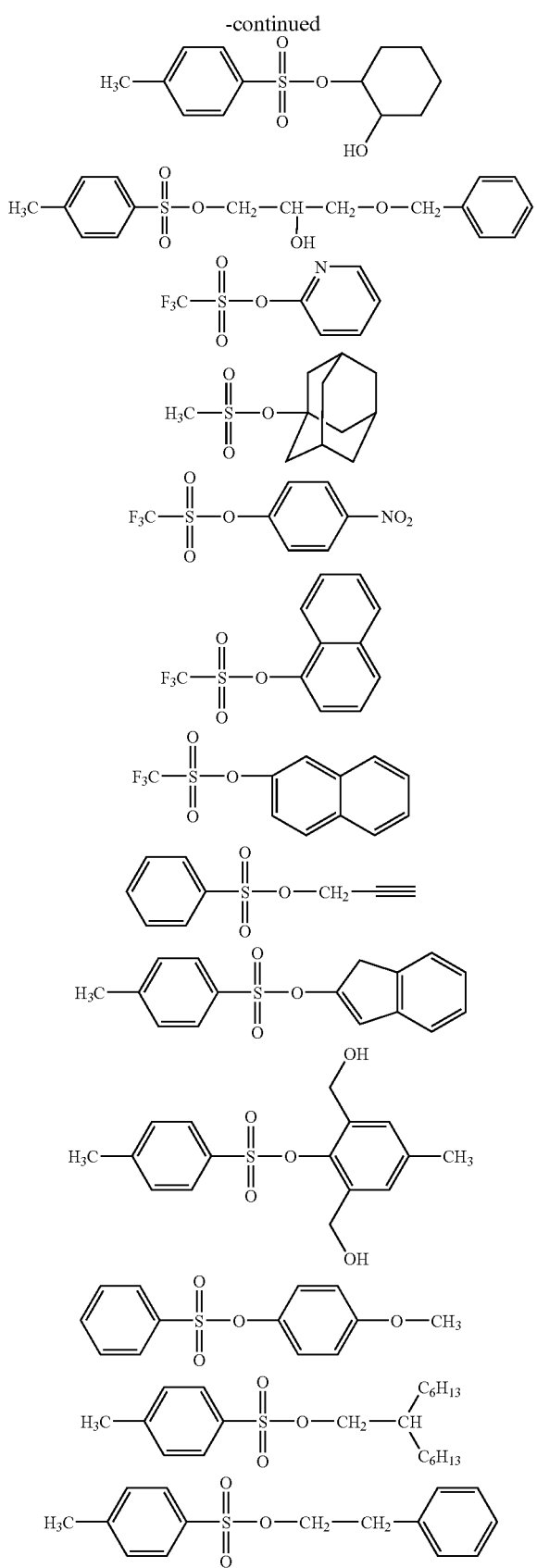

-continued (6) Adhesion Promoter

In the positive photosensitive resin composition of the present invention, an adhesion-imparting agent such as organosilicon compound, silane coupling agent and leveling agent may be added, if desired, for imparting adhesion. Examples thereof include γ-aminopropyltrimethoxysilane, γ-aminopropyltriethoxysilane, vinyltriethoxysilane, γ-glycidoxypropyltriethoxysilane, γ-methacryloxypropyltrimethoxysilane, urea propyltriethoxysilane, tris(acetylacetonato) aluminum and acetylacetate aluminum diisopropylate. In the case of using an adhesion-imparting agent, the amount thereof is preferably from 0.1 to 20 parts by mass, more preferably 0.5 to 10 parts by mass, per 100 parts by mass of the polybenzoxazole precursor.

(7) Pattern Forming Method

As for the method of forming a relief pattern by using the photosensitive resin composition of the present invention, (a) the photosensitive resin composition of the present invention is coated on an appropriate substrate, and (b) the coated substrate is baked, (c) exposed with actinic rays or radiation, (d) developed with an aqueous developer and (e) cured, whereby a cured relief pattern can be formed.

The coated and exposed substrate may be baked at a high temperature in advance of development. Also, the developed substrate may be rinsed before curing.

When the photosensitive resin composition of the present invention is coated in this way on a semiconductor element to give a predetermined thickness (for example from 0.1 to 30 μm) after heat-curing and the coating film is subjected to prebaking, exposure, development and heat-curing, a semiconductor device can be produced.

The method for forming a relief pattern is described in detail below.

The photosensitive resin composition of the present invention is coated on an appropriate substrate. The substrate is, for example, a semiconductor material such as silicon wafer, or a ceramic substrate, glass, metal or plastic. The coating method includes, but is not limited to, spray coating, spin coating, offset printing, roller coating, screen printing, extrusion coating, meniscus coating, curtain coating and dip coating.

The coating film is previously baked at an elevated temperature of about 70 to 120° C. for several minutes to half an hour according to the method so as to evaporate the remaining solvent. Subsequently, the resulting dry film is exposed to actinic rays or radiation in a preferred pattern through a mask. Examples of the actinic ray or radiation which can be used include X-ray, electron beam, ultraviolet ray and visible light. A radiation having a wavelength of 436 nm (g-line) or 365 nm (i-line) is most preferred.

Following the exposure to actinic rays or radiation, it is advantageous to heat the coated and exposed substrate to a temperature of about 70 to 120° C. The coated and exposed substrate is heated at a temperature in this range for a short period of time, generally, from several seconds to several minutes. This step of the method above is usually referred to as post exposure baking in the art.

The coating film is subsequently developed with an aqueous developer and a relief pattern is thereby formed. The aqueous developer includes an alkali solution such as inorganic alkali (e.g., potassium hydroxide, sodium hydroxide, aqueous ammonia), primary amine (e.g., ethylamine, n-propylamine), secondary amine (e.g. diethylamine, di-n-propylamine), tertiary amine (e.g., triethylamine), alcoholamine (e.g. triethanolamine), quaternary ammonium salt (e.g., tetramethylammonium hydroxide, tetraethylammonium hydroxide), and a mixture thereof. The developer is most preferably a developer containing tetramethylammonium hydroxide. In the developer, an appropriate amount of a surfactant may be added. The development can be performed by dipping, spraying, puddling, or other similar developing methods.

Depending on the case, the relief pattern is then rinsed using deionized water. For obtaining a final pattern of highly heat-resistant polymer, the relief pattern is thereafter cured to form an oxazole ring. The curing is performed by baking the substrate at the glass transition temperature Tg of the polymer so as to obtain an oxazole ring that forms a final pattern with high heat resistance. In general, the coating film is heat-cured at a temperature of about 250 to 400° C. On the other hand, in the case of the composition of the present invention, a film having physical properties equal to or better than those of conventional compositions can be obtained at a temperature of 150 to 350° C.

EXAMPLES

The present invention is described in greater detail below by referring to Examples, but the present invention should not be construed as being limited thereto.

[Preparation of PBO Precursor]

(1) Synthesis of Resin A-1

In a 3 liter-volume three-neck flask, 293 g (0.8 mol) of hexafluoro-2,2-bis(3-amino-4-hydroxyphenyl)propane (produced by Nippon Kayaku Co., Ltd.), 126.6 g (1.6 mol) of pyridine and 1.2 kg of N-methyl-2-pyridone (NMP) were added. The resulting solution was stirred at room temperature and then cooled to −25° C. on a dry ice/acetone bath and while maintaining the reaction temperature at −20° C. to −30° C., a mixed solution containing 73.9 g (0.364 mol) of isophthaloyl chloride (produced by Tokyo Kasei Kogyo Co., Ltd.), 107.4 g (0.364 mol) of 4,4'-oxybisbenzoyl chloride (obtained by converting 4,4'-oxybisbenzoic acid (produced by Aldrich) into acid chloride in a usual manner) and 700 g of NMP was added dropwise thereto. After the completion of addition, the obtained mixture was stirred at room temperature for 16 hours and then diluted with 2 L of acetone, and the resulting solution was charged into 50 L of deionized water under vigorous stirring. The precipitated white powder was recovered by filtration and washed with deionized water and further with a water/methanol (50/50) mixture, and the polymer was then dried in vacuum at 40° C. for 24 hours to obtain the objective Resin a-1. The yield was almost quantitative, the number average molecular weight of Resin a-1 was $6.4 \times 10^3$ in terms of polystyrene, and the dispersity was 2.1.

Furthermore, 400 g of Resin (a-1) was dissolved in acetone to give a 15% solution, and 19 g of ethylmalonyl chloride (produced by Aldrich) was added thereto, followed by stirring at room temperature for 3 hours. In order to protect the hydroxyl group, 13 g of acetyl chloride and 25 g of pyridine were added to the reaction solution, and the resulting solution was further stirred for 3 hours. After the completion of reaction, the reaction solution was added dropwise to 40 L of distilled water to precipitate the objective Resin A-1. Resin A-1 which is the precipitated white powder was then collected by filtration and dried to obtain the objective Resin A-1. The yield was 90%, the number average molecular weight of Resin A-1 was $6.5 \times 10^3$ in terms of polystyrene, and the dispersity was 2.1. It was confirmed from $^1$HNMR that the introduction ratio of ethylmalonyl chloride was quantitative and the protection ratio of the hydroxyl group by an acetyl group was 7 mol %.

(2) Synthesis of Resin A-2

Resin A-2 was synthesized in the same manner as in the Synthesis Example of Resin A-1 by using Resin a-1 obtained in the Synthesis Example of Resin A-1 except that cyclohexylmalonyl chloride was used in place of ethylmalonyl chloride. The number average molecular weight of Resin A-2 was $6.5 \times 10^3$ in terms of polystyrene, and the dispersity was 2.1. It was confirmed from $^1$HNMR that the introduction ratio of cyclohexylmalonyl chloride was quantitative and the protection ratio of the hydroxyl group by an acetyl group was 6 mol %.

(3) Synthesis of Resin A-3

Resin a-1 (400 g) obtained in the Synthesis Example of Resin A-1 was dissolved in a 50/50 mixed solvent of diglyme/PGMEA (propylene glycol monomethyl ether acetate), and the solvent was distilled out at 50° C. to remove the water content in the system by azeotropic dehydration, whereby a solution having a solid content concentration of 15% was prepared. The water content in the system was 0.01%. Subsequently, 19 g of ethylmalonyl chloride was added, the resulting solution was stirred at room temperature for 3 hours, and 15 g of ethyl vinyl ether and 0.1 g of p-toluenesulfonic acid were added thereto. The resulting solution was stirred at room temperature for 3 hours, 10 g of triethylamine was added thereto, and the obtained reaction solution was washed with water three times and once diluted by adding 1 L of PGMEA. Thereafter, the solvent was distilled out at 50° C. to remove the water content in the system by azeotropic dehydration, whereby a PGMEA solution of Resin A-3 having a solid content concentration of 40% was obtained. The number average molecular weight of Resin A-3 was $6.5 \times 10^3$ in terms of polystyrene, and the dispersity was 2.1. It was confirmed from $^1$HNMR that the introduction ratio of ethylmalonyl chloride was quantitative and the protection ratio of the hydroxyl group by an ethyl acetal group was 14 mol %.

(4) Synthesis of Resin b-1

In a 3 liter-volume three-neck flask, 293 g (0.8 mol) of hexafluoro-2,2-bis(3-amino-4-hydroxyphenyl)propane, 126.6 g (1.6 mol) of pyridine and 1.2 kg of N-methyl-2-pyridone (NMP) were added. The resulting solution was stirred at room temperature and then cooled to −25° C. on a dry ice/acetone bath and while maintaining the reaction temperature at −20° C. to −30° C., a mixed solution containing 73.9 g (0.364 mol) of isophthaloyl chloride, 107.4 g (0.364 mol) of 4,4'-oxybisbenzoyl chloride and 700 g of NMP was added dropwise thereto. After the completion of addition, the obtained mixture was stirred at room temperature for 16 hours, and the resulting solution was diluted with 2 L of acetone and charged into 50 L of deionized water under vigorous stirring. The precipitated white powder was recovered by filtration and washed with deionized water and further with a water/methanol (50/50) mixture, and the polymer was then dried in vacuum at 40° C. for 24 hours to obtain the objective resin. The yield was almost quantitative, the number average molecular weight of this resin was $6.3 \times 10^3$ in terms of polystyrene, and the dispersity was 2.0.

Furthermore, 400 g of the resin obtained was dissolved in acetone to give a 15% solution, and 19 g of ethylmalonyl chloride was added thereto, followed by stirring at room temperature for 3 hours. The resulting solution was diluted with 2 L of acetone and charged into 50 L of deionized water under vigorous stirring, and the precipitated white powder was recovered by filtration and washed with deionized water and further with a water/methanol (50/50) mixture. The polymer was then dried in vacuum at 40° C. for 24 hours to obtain the objective Resin b-1. The number average molecular weight of this resin was $6.4 \times 10^3$ in terms of polystyrene, and the dispersity was 2.1. It was confirmed from $^1$HNMR that the introduction ratio of ethylmalonyl chloride was quantitative.

[Synthesis of Photosensitizing Agent]

(1) Synthesis of Photosensitizing Agent (P-1)

In a three-neck flask, 21.6 g of a phenol compound (BP-1) shown below and 200 ml of 1,4-dioxane were added and dissolved until the system became uniform. Subsequently, 27 g of 1,2-naphthoquinonediazide-4-sulfonyl chloride was added thereto and dissolved. The reaction vessel was cooled to 10° C. with ice water, and 1.1 g of triethylamine was added dropwise thereto over 1 hour. After the completion of the dropwise addition, the solution was stirred for 24 hours and after the completion of reaction, distilled water was added to dissolve the precipitated salt. The resulting solution was stirred for 30 minutes, neutralized with dilute hydrochloride acid and crystallized from 1 L of distilled water. The precipitated dark yellow powder was collected by filtration, again dissolved in 200 ml of dioxane and crystallized from 1 L of distilled water. Thereafter, the precipitated powder was collected by filtration, washed with 1 L of distilled water and then filtered to recover 39 g of the objective (P-1) as a dark yellow powder. The obtained (P-1) was analyzed by high-performance liquid chromatography (S1525, manufactured by Waters), as a result, the purity of the esterified product of the phenol compound (BP-1) was 98% (detection wavelength: 254 nm).

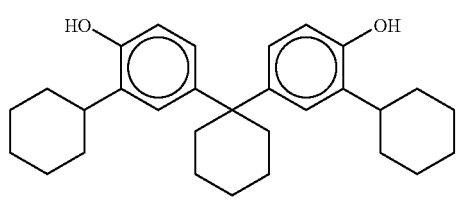

(BP-1)

(2) Synthesis of Photosensitizing Agent (P-2)

Photosensitizing Agent (P-2) was synthesized in the same manner as in Synthesis Example above except for changing the phenol compound used to (BP-2) shown below and doubling the amount of 1,2-naphthoquinonediazide-4-sulfonyl chloride used. The obtained (P-2) was analyzed by high-performance liquid chromatography (S1525, manufactured by Waters), as a result, the purity of the esterified product of the phenol compound (BP-2) was 97.5% (detection wavelength: 254 nm)

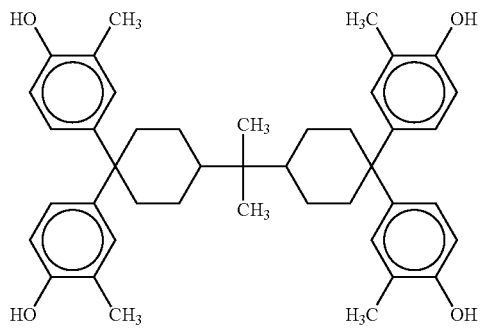

(BP-2)

[Preparation of Photosensitive Resin Composition]

The resin, photosensitizing agent, additive and solvent shown in Table 1 were mixed and stirred, and the resulting solution was filtered through a PTFE-made cassette filter (0.1 μm) to prepare a photosensitive resin composition.

TABLE 1

| | | Formulation of Composition | | | | |
|---|---|---|---|---|---|---|
| | | Resin | Sensitizer | Additive | Other Additives | Solvent |
| Example | 1 | A-1 (50 g) | P-2 (6.5 g) | ADD1-1 (6.5 g) | — | GBL (160 g) |
| | 2 | A-1 (50 g) | P-1 (6.8 g) | ADD1-1 (6.5 g) | ADD2-1 (1.0 g) | GBL (160 g) |
| | 3 | A-2 (50 g) | P-2 (6.5 g) | ADD1-2 (5.0 g) | ADD2-2 (1.5 g) | GBL (160 g) |
| | 4 | A-3 (50 g) | P-3 (2.5 g) | ADD1-3 (6.0 g) | ADD2-1 (1.5 g) | GBL (160 g) |
| | 5 | A-1 (50 g) | P-1/P-3 (5.0 g/2.5 g) | ADD1-4 (8.0 g) | ADD2-2 (1.0 g) | GBL (160 g) |
| | 6 | A-2 (50 g) | P-2/P-3 (6.0 g/2.0 g) | ADD1-5 (6.5 g) | ADD2-1 (1.0 g) | GBL (160 g) |
| | 7 | A-1/A-3 (25 g/25 g) | P-1/P-4 (6.0 g/3.0 g) | ADD1-6 (5.5 g) | ADD2-2/ADD3-1 (1.5 g/3.0 g) | GBL (160 g) |
| | 8 | A-1/A-3 (10 g/40 g) | P-3/P-4 (2.5 g/4.0 g) | ADD1-7/ADD1-1 (3.5 g/3.5 g) | ADD2-1/ADD3-2 (1.5 g/1.5 g) | GBL (160 g) |
| | 9 | A-3 (50 g) | P-1/P-3 (5.0 g/2.5 g) | ADD1-1 (6.5 g) | ADD3-3 (6.5 g) | GBL (160 g) |
| Comparative Example | 1 | a-1 (50 g) | P-1 (6.8 g) | — | ADD2-2 (1.0 g) | GBL (160 g) |
| | 2 | a-1 (50 g) | P-2 (6.5 g) | — | ADD2-1/ADD3-2 (1.5 g/1.5 g) | GBL (160 g) |
| | 3 | b-1 (50 g) | P-1 (6.8 g) | — | — | GBL (160 g) |

The compounds indicated by abbreviations in Table 1 and used as the photosensitizing agent, additive and other additives are shown below.

P-1
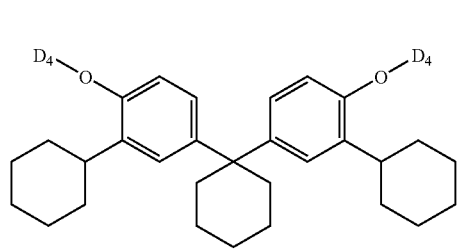
P-2
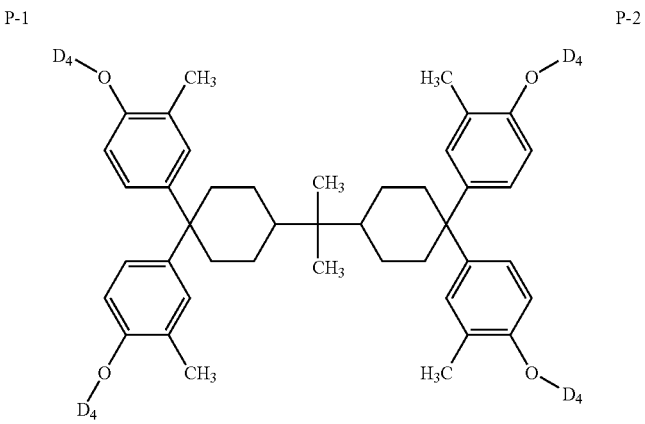
P-3
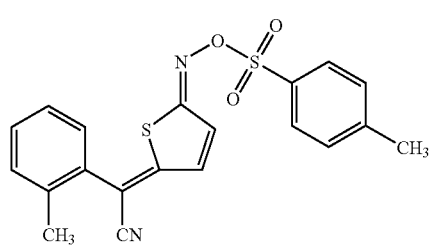
P-4
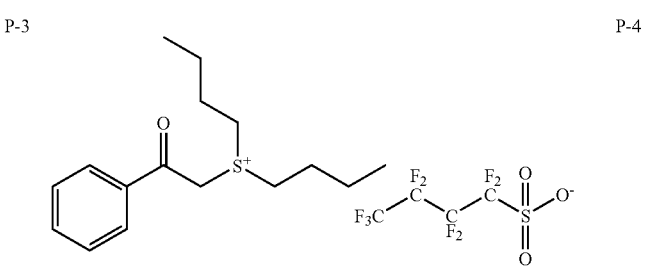
ADD1-1
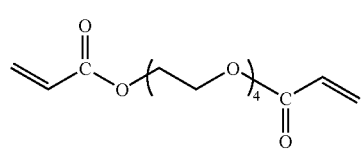
ADD1-2
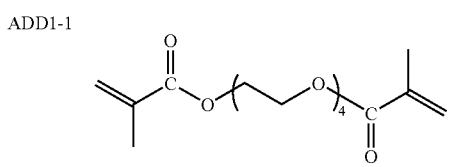
ADD1-3
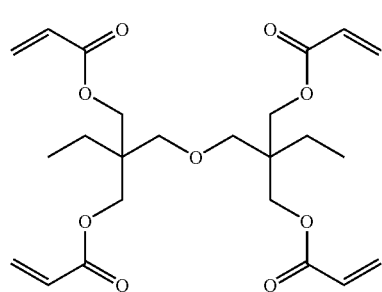
ADD1-4
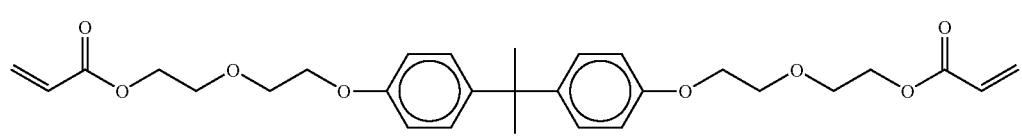
ADD1-5
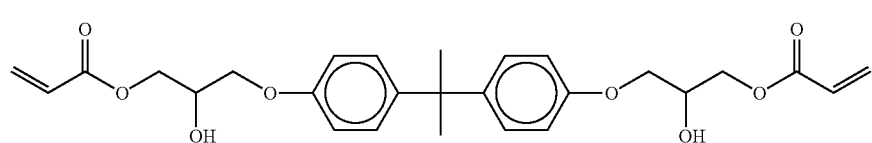

-continued

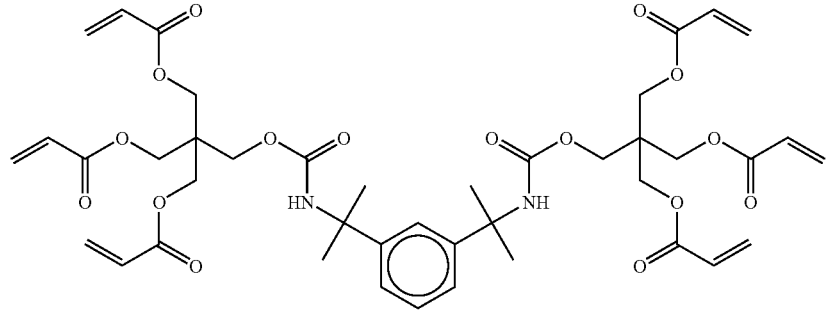
ADD1-6

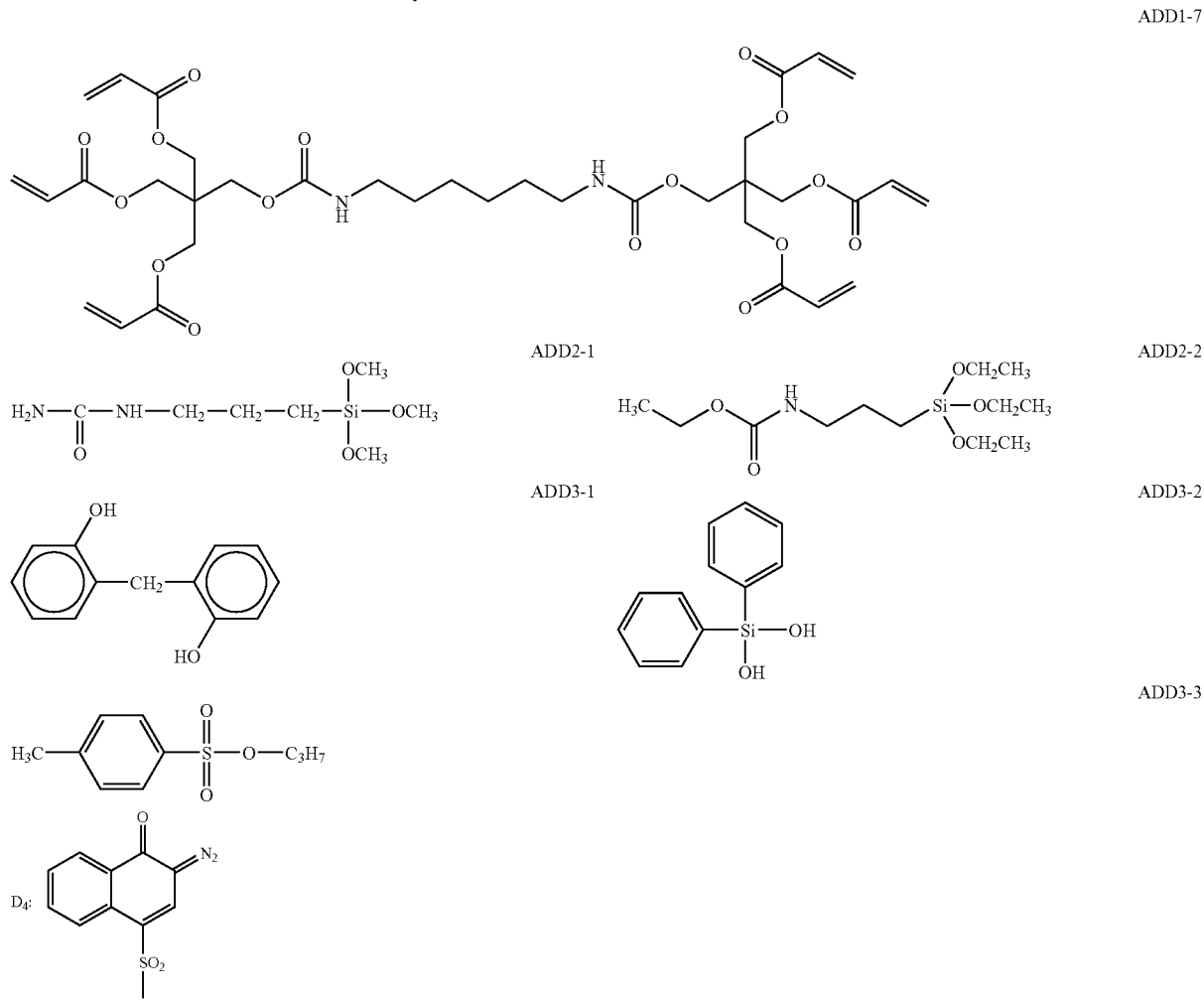

(3) Evaluation of Sensitivity, Residual Film Ratio and Mask Bias

The composition prepared was spin-coated on a silicon wafer and baked on a hot plate at 120° C. for 4 minutes to obtain a film having a thickness of 9 μm. This film was exposed using an i-line stepper and a mask containing a 100-micron via hole repeating pattern and a 5 micron (width)×25 micron (height) pattern, then subjected to stationary development for 40 seconds by putting an aqueous 0.262N TMAH solution on the substrate, further subjected to stationary development for 40 seconds by newly putting on an aqueous 0.262N TMAH solution, subsequently rinsed with deionized water and thereafter baked on a hot plate at 100° C. for 2 minutes. The exposure amount reproducing the 10-micron via hole pattern was taken as the optimal sensitivity. The size in the transverse direction of the 5 micron (width)×25 micron (height) mask pattern at the optimal sensitivity was measured, and the difference in the dimension from the designed mask size of 5 micron [measured size (micron)−5 micron] was defined as the mask bias. Furthermore, the residual film amount after development was measured, and the ratio to the film thickness before development (film thickness after development/film thickness before development× 100) was defined as the residual film ratio. The measurement results are shown in Table 2.

(4) Evaluation of Elongation at Break

The resin solution prepared was spin-coated on a silicon wafer, then baked on a hot plate at 120° C. for 4 minutes and further heat-cured under the nitrogen condition at 300° C. for 30 minutes and at 350° C. for 60 hours, and the obtained resin film was peeled off from the wafer and cut into a size of 5 mm in width and 7 cm in length.

The sample obtained was fixed at both ends each in 1 cm by Tensilon and pulled (5 mm/min), and the elongation until the film was ruptured (elongation at break) was measured. The results are shown in Table 2.

TABLE 2

| | Evaluation Results | | | |
|---|---|---|---|---|
| | Sensitivity (mJ/cm$^2$) | Residual Film Ratio (%) | Mask Bias (μm) | Elongation at Break (%) |
| Example 1 | 290 | 87 | 1.9 | 60 |
| Example 2 | 300 | 85 | 2.0 | 60 |
| Example 3 | 320 | 90 | 1.8 | 55 |
| Example 4 | 200 | 95 | 1.0 | 50 |
| Example 5 | 280 | 80 | 1.5 | 70 |
| Example 6 | 290 | 85 | 1.6 | 65 |
| Example 7 | 250 | 90 | 1.1 | 65 |
| Example 8 | 200 | 95 | 1.0 | 60 |
| Example 9 | 260 | 92 | 1.2 | 75 |
| Comparative Example 1 | 350 | 50 | 3.0 | 35 |
| Comparative Example 2 | 300 | 40 | 3.5 | 35 |
| Comparative Example 3 | 400 | 45 | 3.0 | 30 |

It is seen from the results in Table 2 that a cured film with high sensitivity, high residual film ratio, small mask bias and excellent mechanical properties is obtained from the photosensitive resin compositions of Examples 1 to 9.

This application is based on Japanese Patent application JP 2006-264818, filed Sep. 28, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A photosensitive resin composition comprising:
   a polymer represented by the following formula (I);
   a photosensitizing agent;
   a compound containing a methacryloyl or acryloyl group within a molecule of the compound; and
   a solvent:

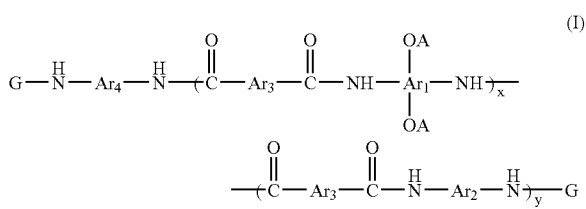

wherein Ar$_1$ represents a group selected from a tetravalent aromatic group and a tetravalent heterocyclic group, Ar$_2$ represents a group selected from a divalent aromatic group, a divalent heterocyclic group, a divalent alicyclic group and a divalent aliphatic group which may contain silicon, Ar$_3$ represents a group selected from a divalent aromatic group, a divalent heterocyclic group, a divalent aliphatic group and a divalent alicyclic group, Ar$_4$ represents a group selected from —Ar$_1$(OA)$_2$- and Ar$_2$, A represents a hydrogen atom or a protective group capable of decomposing by a reaction with an acid, G represents a monovalent organic group bonded through a carbonyl group or a sulfonyl group, x represents a number of from 5 to 1,000, and y represents a number of from 0 to 900, provided that 0.5 mol % or more of A in the polymer represented by the formula (I) is a protective group.

2. The positive photosensitive resin composition as claimed in claim 1, wherein the protective group represented by A is a protective group capable of decomposing under heating at from 150 to 350° C.

3. The positive photosensitive resin composition as claimed in claim 1, wherein the photosensitizing agent is a photoacid generator.

4. The photosensitive resin composition as claimed in claim 1, wherein a photoacid generator and a quinonediazide compound are contained as the photosensitizing agent.

5. The positive photosensitive resin composition as claimed in claim 1, which further comprises a sulfonic acid ester compound.

6. The positive photosensitive resin composition as claimed in claim 1, which further comprises an adhesion promoter.

7. A production method of a cured relief pattern, comprising: forming a layer of the positive photosensitive resin composition claimed in claim 1 on a semiconductor substrate; exposing the layer to a light beam, an electron beam or an ion beam through a mask; removing the exposed area with an aqueous alkali developer to obtain a relief pattern; and heat-treating the obtained relief pattern.

8. A semiconductor device comprising a cured relief pattern obtained by the production method claimed in claim 7.

* * * * *